(12) United States Patent
Aoki et al.

(10) Patent No.: US 8,699,001 B2
(45) Date of Patent: Apr. 15, 2014

(54) OBJECT MOVING APPARATUS, OBJECT PROCESSING APPARATUS, EXPOSURE APPARATUS, OBJECT INSPECTING APPARATUS AND DEVICE MANUFACTURING METHOD

(75) Inventors: Yasuo Aoki, Zushi (JP); Tomohide Hamada, Yokohama (JP); Hiroshi Shirasu, Yokohama (JP); Manabu Toguchi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/855,181

(22) Filed: Aug. 12, 2010

(65) Prior Publication Data
US 2011/0043784 A1 Feb. 24, 2011

Related U.S. Application Data

(60) Provisional application No. 61/235,490, filed on Aug. 20, 2009.

(51) Int. Cl.
*G03B 27/58* (2006.01)
*G03F 7/20* (2006.01)
*H01L 21/677* (2006.01)
*B65G 49/06* (2006.01)

(52) U.S. Cl.
CPC ............ *G03F 7/707* (2013.01); *G03F 7/70797* (2013.01); *H01L 21/67784* (2013.01); *B65G 49/065* (2013.01)
USPC ............................................. 355/72; 414/676

(58) Field of Classification Search
CPC ............ H01L 21/6838; H01L 21/67784; B65G 49/065; G03F 7/707; G03F 7/70733; G03F 7/07816; G03F 7/70791
USPC ................... 355/53, 72, 75; 414/676
See application file for complete search history.

(56) References Cited

U.S. PATENT DOCUMENTS 5,448,332 A 9/1995 Sakakibara et al.
6,040,096 A * 3/2000 Kakizaki et al. ................. 430/5

(Continued)

FOREIGN PATENT DOCUMENTS

JP A-2004-238133 8/2004
JP 2008147291 A * 6/2008

(Continued)

OTHER PUBLICATIONS

International Search Report issued in International Application No. PCT/JP2010/064131 on Dec. 6, 2010.

(Continued)

*Primary Examiner* — Steven H Whitesell Gordon
(74) *Attorney, Agent, or Firm* — Oliff PLC

(57) ABSTRACT

A substrate is held by adsorption by a substrate holding frame that is formed into a frame shape and is lightweight, and the substrate holding frame is driven along a horizontal plane by a drive unit that includes a linear motor. Below the substrate holding frame, a plurality of air levitation units are placed that support by levitation the substrate in a noncontact manner such that the substrate is substantially horizontal, by jetting air to the lower surface of the substrate. Since the plurality of air levitation units cover a movement range of the substrate holding frame, the drive unit can guide the substrate holding frame (substrate) along the horizontal plane at high speed and with high precision.

34 Claims, 17 Drawing Sheets

(56) References Cited

U.S. PATENT DOCUMENTS

| | | |
|---|---|---|
| 6,333,572 B1 | 12/2001 | Ono |
| 6,552,775 B1 | 4/2003 | Yanagihara et al. |
| 6,559,928 B1* | 5/2003 | Aoki ............................... 355/72 |
| 6,778,257 B2 | 8/2004 | Bleeker et al. |
| 6,810,297 B2* | 10/2004 | Adin et al. ...................... 700/110 |
| 7,530,778 B2* | 5/2009 | Yassour et al. ................. 414/676 |
| 7,607,647 B2 | 10/2009 | Zhao et al. |
| 7,905,195 B2* | 3/2011 | Yamasaki et al. ............. 118/300 |
| 7,908,995 B2* | 3/2011 | Inamasu et al. ............... 118/300 |
| 7,918,939 B2* | 4/2011 | Fukuoka et al. ............... 118/719 |
| 8,106,330 B2* | 1/2012 | Arao et al. ................. 219/121.82 |
| 8,137,046 B2* | 3/2012 | Kishimoto et al. ........... 414/676 |
| 2003/0098964 A1 | 5/2003 | Lee et al. |
| 2003/0098965 A1 | 5/2003 | Binnard et al. |
| 2005/0040338 A1 | 2/2005 | Weiss et al. |
| 2006/0096395 A1 | 5/2006 | Weiss et al. |
| 2006/0098176 A1* | 5/2006 | Gui et al. ......................... 355/53 |
| 2006/0284434 A1 | 12/2006 | Yang |
| 2007/0017442 A1* | 1/2007 | Yamasaki et al. ............. 118/695 |
| 2007/0195653 A1* | 8/2007 | Yassour et al. ............. 369/13.24 |
| 2007/0296936 A1* | 12/2007 | Kato et al. ....................... 355/52 |
| 2008/0013060 A1 | 1/2008 | Ichinose et al. |
| 2008/0014075 A1 | 1/2008 | Pun et al. |
| 2008/0030702 A1 | 2/2008 | Kawanura |
| 2008/0088843 A1 | 4/2008 | Shibazaki |
| 2008/0229811 A1 | 9/2008 | Zhao et al. |
| 2010/0018950 A1 | 1/2010 | Aoki et al. |
| 2011/0042874 A1 | 2/2011 | Aoki et al. |
| 2011/0053092 A1 | 3/2011 | Aoki |
| 2011/0318144 A1* | 12/2011 | Kobayashi et al. ...... 414/222.01 |
| 2012/0056105 A1 | 3/2012 | Aoki |
| 2012/0064460 A1 | 3/2012 | Aoki |
| 2012/0064461 A1 | 3/2012 | Aoki |

FOREIGN PATENT DOCUMENTS

| | | |
|---|---|---|
| JP | A-2009-271340 | 11/2009 |
| JP | A-2010-054849 | 3/2010 |
| WO | WO 2004096679 A1 * | 11/2004 |
| WO | WO 2008/121561 A1 | 10/2008 |
| WO | WO 2008/129762 A1 | 10/2008 |
| WO | WO 2011016369 A1 * | 2/2011 |
| WO | WO 2011102410 A1 * | 8/2011 |
| WO | WO 2012046439 A1 * | 4/2012 |

OTHER PUBLICATIONS

Written Opinion of the International Searching Authority issued in International Application No. PCT/JP2010/064131 on Dec. 6, 2010.
Feb. 3, 2012 International Search Report and Written Opinion issued in International Application No. PCT/JP2011/070666.
Feb. 3, 2012 International Search Report and Written Opinion issued in International Application No. PCT/JP2011/070667.
Dec. 6, 2010 International Search Report and Written Opinion issued in International Application No. PCT/JP2010/064134.
Dec. 6, 2010 International Search Report and Written Opinion issued in International Application No. PCT/JP2010/064430.
Feb. 6, 2012 International Search Report and Written Opinion issued in International Application No. PCT/JP2011/071171.
Office Action issued in U.S. Appl. No. 13/221,420 dated Sep. 6, 2012.
Office Action issued in U.S. Appl. No. 12/859,484 dated Nov. 23, 2012.
Jun. 27, 2013 Office Action issued in U.S. Appl. No. 12/855,283.
Jul. 17, 2013 Office Action issued in U.S. Appl. No. 12/859,484.

* cited by examiner

OBJECT MOVING APPARATUS, OBJECT PROCESSING APPARATUS, EXPOSURE APPARATUS, OBJECT INSPECTING APPARATUS AND DEVICE MANUFACTURING METHOD

CROSS-REFERENCE TO RELATED APPLICATIONS

This non-provisional application claims the benefit of Provisional Application No. 61/235,490 filed Aug. 20, 2009, the disclosure of which is hereby incorporated herein by reference in its entirety.

BACKGROUND OF THE INVENTION

1. Field of the Invention

The present invention relates to object moving apparatuses, object processing apparatuses, exposure apparatuses, object inspecting apparatuses and device manufacturing methods, and more particularly to an object moving apparatus that moves a tabular object placed along a predetermined two-dimensional plane, an object processing apparatus that performs predetermined processing to the object that is moved by the object moving apparatus, an exposure apparatus that forms a predetermined pattern by exposing the object moved by the object moving apparatus, an object inspecting apparatus that inspects the object moved by the object moving apparatus, and a device manufacturing method that uses the object processing apparatus or the exposure apparatus.

2. Description of the Background Art

Conventionally, in a lithography process for manufacturing electron devices (microdevices) such as liquid crystal display elements or semiconductor devices (integrated circuits or the like), an exposure apparatus such as a projection exposure apparatus by a step-and-repeat method (a so-called stepper) or a projection exposure apparatus by a step-and-scan method (a so-called scanning stepper (which is also called a scanner)) is mainly used.

In this type of the exposure apparatus, a substrate such as a glass plate or a wafer whose surface is coated with a photosensitive agent (hereinafter, generically referred to as a substrate), which serves as an exposure subject, is mounted on a substrate stage device. And, exposure light is irradiated on a mask (or a reticle) on which a circuit pattern formed, and the exposure light via the mask is irradiated on a substrate via an optical system such as a projection lens, and thereby the circuit pattern is transferred onto the substrate (e.g. refer to PCT International Publication No. 2008/129762 (the corresponding U.S. Patent Application Publication No. 2010/0010950)).

In recent years, however, a substrate that is an exposure subject in an exposure apparatus, especially, a substrate for liquid crystal display element (a rectangular glass substrate) has tended to grow in size, for example, the length of a side of the substrate has been increased to 3 m or more, and accordingly, a stage device of the exposure apparatus has also grown in size, and its weight has also increased. Therefore, the development of a stage device has been desired that can guide an exposure subject (substrate) at high speed and with high precision, and further, has a simple configuration with which the size and weight can be reduced.

SUMMARY OF THE INVENTION

According to a first aspect of the present invention, there is provided an object moving apparatus that moves a tabular object placed along a predetermined two-dimensional plane that includes a first axis and a second axis orthogonal to each other, the apparatus comprising: a movable body that holds an end of the object and is movable along the two-dimensional plane; a drive device that drives the movable body at least in one axial direction within the two-dimensional plane; and a noncontact support device that supports the object in a noncontact manner from below, with its support surface made to be opposed to a lower surface of the object, when the movable body is driven by the drive device.

With this apparatus, the end of the tabular object is held by the movable body and the movable body is driven by the drive device, and thereby the tabular object moves along a predetermined two-dimensional plane. Further, since the object is supported from below by the noncontact support device, downward deformation (bending) of the object owing to the self weight is restrained although only the end of the object is supported by the movable body. Consequently, the object can be guided along the predetermined two-dimensional plane with high accuracy. Further, since the noncontact support device supports the object in a noncontact manner, frictional resistance is not generated when the object moves along the predetermined two-dimensional plane. Consequently, the drive device can drive a system composed of the movable body and the object at high speed and with high precision. Further, since, the configurations of the movable body and the drive device can be simplified, the object moving apparatus as a whole can be reduced in size and weight.

According to a second aspect of the present invention, there is provided an object processing apparatus, comprising: the object moving apparatus of the present invention; and an executing device that executes a predetermined operation on a section, held by the adjustment device, of the object from a side opposite to the adjustment device, in order to perform predetermined processing on the object.

With this apparatus, since a predetermined operation is executed on the object that is guided along a predetermined two-dimensional plane by the object moving apparatus of the present invention, predetermined processing can be performed on the object at high speed and with high accuracy.

According to a third aspect of the present invention, there is provided a first exposure apparatus, comprising: the object moving apparatus of the present invention; and a pattern forming apparatus that forms a predetermined pattern on the object by exposing the object with an energy beam.

With this apparatus, since exposure is performed, using an energy beam, on the object that is guided along a predetermined two-dimensional plane by the object moving apparatus of the present invention, a predetermined pattern can be formed on the object at high speed and with high precision.

According to a fourth aspect of the present invention, there is provided an object inspecting apparatus, comprising: the object moving apparatus of the present invention; and an imaging section that picks up an image of a surface of the object to inspect the object.

With this apparatus, since the object that is subject to inspection is guided along a predetermined two-dimensional plane by the object moving apparatus of the present invention at high speed and with high precision, the inspection of the object can efficiently be performed.

According to a fifth aspect of the present invention, there is provided a second exposure apparatus that forms a predetermined pattern on an object by exposing the object with an energy beam, the apparatus comprising: a movable body which holds an end of a tabular object placed along a predetermined two-dimensional plane that includes a first axis and a second axis orthogonal to each other, and which is movable along the two-dimensional plane; a drive device that drives the movable body at least in one axial direction within the two-dimensional plane; and a noncontact support device that supports the object in a noncontact manner from below, when the movable body is driven by the drive device.

With this apparatus, the end of the tabular object is held by the movable body and the movable body is driven by the drive device, and thereby the object moves along a predetermined two-dimensional plane. Further, since the object is supported from below by the noncontact support device, the downward deformation (bending) of the object because of its empty weight is restrained although only the end of the object is supported by the movable body. Consequently, the object can be guided along the predetermined two-dimensional plane with high accuracy. Further, since the noncontact support device supports the object in a noncontact manner, frictional resistance is not generated when the object moves along the predetermined two-dimensional plane. Consequently, the drive device can drive a system composed of the movable body and the object at high speed and with high precision. Further, exposure is performed on the object using an energy beam, it becomes possible to form a predetermined pattern on the object at high speed and with high precision.

According to a sixth aspect of the present invention, there is provided a third exposure apparatus that forms a predetermined pattern on an object by exposing the object with an energy beam, the apparatus comprising: an optical system that irradiates the energy beam via the pattern on a partial area within a predetermined two-dimensional plane parallel to a horizontal plane; a drive device that drives a tabular object placed along the two-dimensional plane, at least in one axial direction within a predetermined area that includes the partial area within the two-dimensional plane; and a fixed-point stage that holds a section, including the partial area on which the energy beam is irradiated, of the object in a noncontact state from below the object, and that adjusts a position of the section in a direction intersecting the two-dimensional plane, when the object is driven by the drive device.

With this apparatus, the drive device drives the tabular object placed along the two-dimensional plane, at least in one axial direction within the predetermined area within the two-dimensional plane that includes the partial area on which an energy beam via the pattern is irradiated by the optical system. On the driving, the section, which includes the partial area on which the energy beam is irradiated, of the object is held in a noncontact manner from below, by especially the fixed-point stage, and the position of the section in the direction intersecting the two-dimensional plane is adjusted. Consequently, the object can be exposed with high accuracy. Further, since the fixed-point stage adjusts only the portion, irradiated with the energy beam, of the object in a pinpoint manner, the apparatus configuration can be simplified.

According to a seventh aspect of the present invention, there is provided a device manufacturing method, comprising: exposing the object using the object processing apparatus or the exposure apparatus of the present invention; and developing the exposed object.

In this case, there is provided a manufacturing method of manufacturing a flat-panel display as a device, by using a substrate for a flat-panel display as an object.

According to an eighth aspect of the present invention, there is provided an exposure method of forming a predetermined pattern on an object by exposing the object with an energy beam, the method comprising: driving a tabular object placed along a two-dimensional plane parallel to a horizontal plane, at least in one axial direction within a predetermined area, which includes a partial area on which the energy beam via the pattern is irradiated by an optical system, within the predetermined two-dimensional plane; and holding a section that includes the partial area, on which the energy beam is irradiated, of the object in a noncontact state from below the object, and adjusting a position of the section in a direction intersecting the two-dimensional plane, when the object is driven.

With this method, the tabular object placed along the two-dimensional plane is driven at least in one axial direction within a predetermined area within the two-dimensional plane that includes the partial area on which an energy beam via the pattern is irradiated by the optical system. On the driving, the section, including the partial area on which the energy beam is irradiated, of the object is held in a noncontact manner, especially from below, and the position of the section in the direction intersecting the two-dimensional plane is adjusted. Consequently, the object can be exposed with high accuracy.

According to a ninth aspect of the present invention, there is provided a device manufacturing method, comprising: exposing the object the exposure method of the present invention; and developing the exposed object.

BRIEF DESCRIPTION OF DRAWINGS

In the accompanying drawings.

DESCRIPTION OF EMBODIMENTS

First Embodiment

A first embodiment of the present invention is described below, with reference to FIGS. 1 to 6C.

Figure 1:
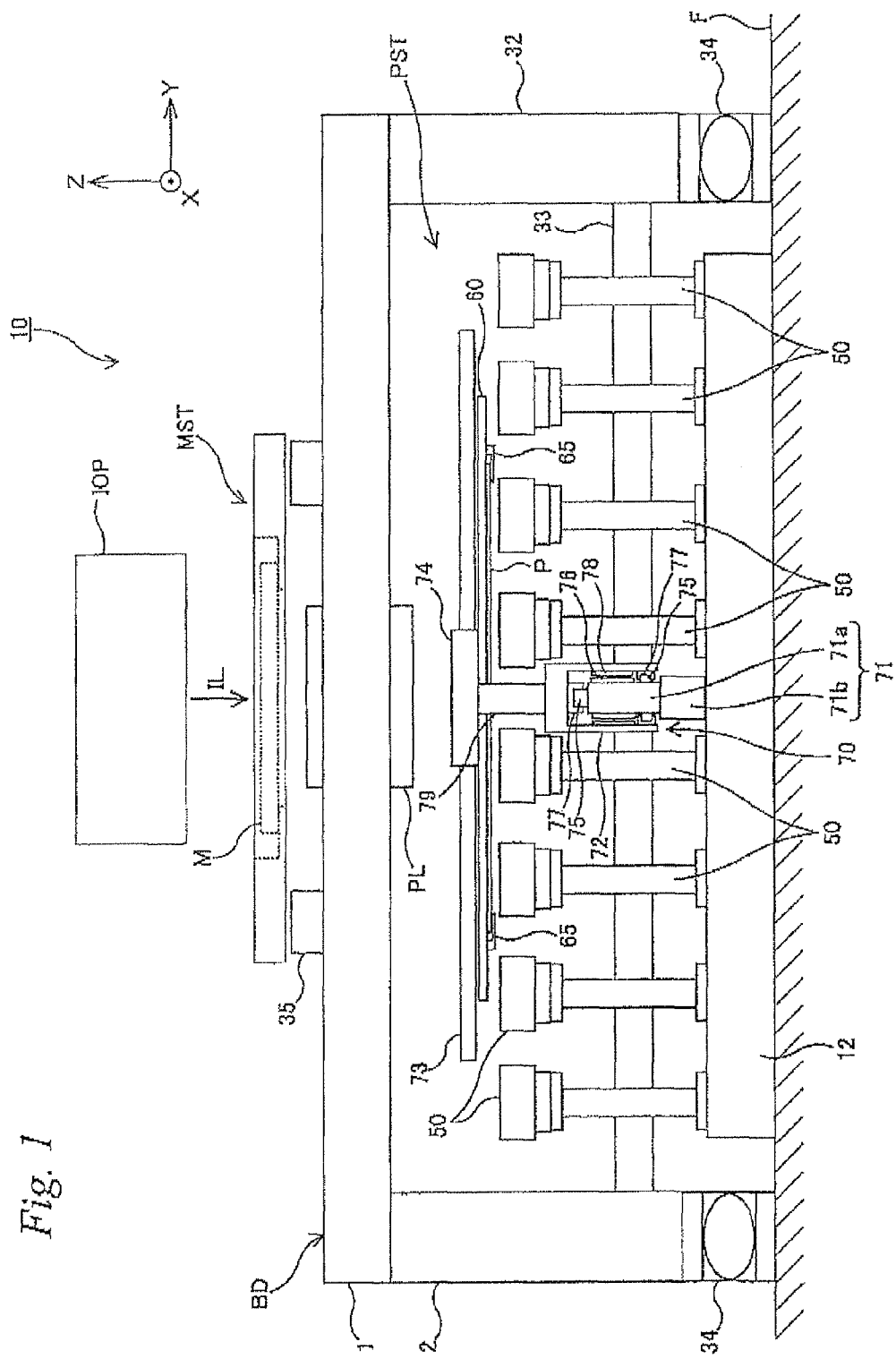
FIG. 1 is a view showing a schematic configuration of a liquid crystal exposure apparatus of a first embodiment.

FIG. 1 shows a schematic configuration of a liquid crystal exposure apparatus 10 related to the first embodiment that is used in manufacturing of flat-panel displays, for example, liquid crystal display devices (liquid crystal panels) or the like. Liquid crystal exposure apparatus 10 is a projection exposure apparatus by a step-and-scan method, in which a rectangular glass substrate P (hereinafter, simply referred to as a substrate P) that is used for a display panel of a liquid crystal display device serves as an exposure subject, which is a so-called scanner.

As shown in FIG. 1, liquid crystal exposure apparatus 10 is equipped with illumination system IOP, a mask stage MST that holds a mask M, a projection optical system PL, a body BD on which mask stage MST and projection optical system PL described above and the like are mounted, a substrate stage device PST that holds substrate P, and their control system, and the like. In the description below, the explanation is given assuming that a direction in which mask M and substrate P are scanned relative to projection optical system PL, respectively, during exposure is an X-axis direction, a direction orthogonal to the X-axis direction within a horizontal plane is a Y-axis direction, and a direction orthogonal to the X-axis and the Y-axis is a Z-axis direction, and rotational (tilt) directions around the X-axis, Y-axis and Z-axis are θx, θy and θz directions, respectively.

Illumination system IOP is configured similar to the illumination system that is disclosed in, for example, U.S. Pat. No. 6,552,775 and the like. More specifically, illumination system IOP irradiates mask M with a light emitted from a light source that is not illustrated (e.g. a mercury lamp), as an illumination light for exposure (illumination light) IL, via a reflection mirror, a dichroic mirror, a shutter, a wavelength selecting filter, various types of lenses and the like, which are not illustrated. As illumination light IL, for example, alight such as an i-line (with a wavelength of 365 nm), a g-line (with a wavelength of 436 nm) or an h-line (with a wavelength of 405 nm) (or a synthetic light of the i-line, the g-line and the h-line described above) is used. Further, the wavelength of illumination light IL can be appropriately switched by the wavelength selecting filter, for example, according to the required resolution.

On mask stage MST, mask M having a pattern surface (the lower surface in FIG. 1) on which a circuit pattern and the like are formed is fixed by, for example, vacuum adsorption (or electrostatic adsorption). Mask stage MST is supported by levitation in a noncontact state, for example, via air bearings that are not illustrated, above a pair of mask stage guides 35 that are fixed to the upper surface of a barrel surface plate 31 that is a part of body BD to be described later on. Mask stage MST is driven in a scanning direction (the X-axis direction) with a predetermined stroke and also is finely driven in the Y-axis direction and the θz direction as needed, above the pair of mask stage guides 35, by a mask stage driving system (not illustrated) that includes, for example, a liner motor. Positional information of mask stage MST within the XY plane (which includes rotational information in the θz direction) is measured by a mask interferometer system that includes a laser interferometer that is not illustrated.

Projection optical system PL is supported below mask stage MST in FIG. 1, by barrel surface plate 31. Projection optical system PL of the present embodiment has a configuration similar to the projection optical system disclosed in, for example, U.S. Pat. No. 6,552,775. More specifically, projection optical system PL includes a plurality of projection optical systems that have projection areas with a predetermined shape, e.g. a trapezoidal shape, of the pattern image of mask M that are placed in a zigzag shape (multi-lens projection optical systems), and functions equivalently to a projection optical system that has a rectangular single image field whose longitudinal direction is in the Y-axis direction. In the present embodiment, as each of the plurality of projection optical systems, for example, a both-side telecentric equal-magnification system that forms an erected normal image is used. Further, in the description below, the plurality of projection areas placed in the zigzag shape of projection optical system PL are collectively referred to as an exposure area IA (see FIG. 2).

Therefore, when an illumination area on mask M is illuminated with illumination light IL from illumination system IOP, by illumination lights IL that have passed through mask M whose pattern surface is placed substantially coincident with the first plane (object plane) of projection optical system PL, a projected image (partial erected image) of a circuit pattern of mask M within the illumination area is formed on an irradiation area (exposure area IA) of illumination light IL, which is conjugate to the illumination area, on substrate P which is placed on the second plane (image plane) side of projection optical system PL and whose surface is coated with a resist (sensitive agent), via projection optical system PL. Then, by moving mask M relative to the illumination area (illumination light IL) in the scanning direction (X-axis direction) and also moving substrate relative to exposure area IA (illumination light IL) in the scanning direction (X-axis direction) by synchronous drive of mask stage MST and substrate stage device PST, scanning exposure of one shot area (divided area) on substrate P is performed, and a pattern of mask M (mask pattern) is transferred onto the shot area. More specifically, in the present embodiment, a pattern of mask M is generated on substrate P by illumination system IOP and projection optical system PL, and the pattern is formed on substrate P by exposure of a sensitive layer (resist layer) on substrate P with illumination light IL.

As disclosed in, for example, U.S. Patent Application Publication No. 2008/0030702 and the like, body BD has barrel surface plate 31 described earlier, and a pair of support walls 32 that support the ends on the +Y side and the −Y side of barrel surface plate 31 from below, on a floor surface F. Each of the pair of support walls 32 is supported on floor surface F via a vibration isolation table 34 that includes, for example, an air spring, and body BD is separated from floor surface F in terms of vibration. Further, between the pair of support walls 32, a Y beam 33 made up of a member having a rectangular sectional shape (see FIG. 3) arranged extending parallel to the Y-axis is installed. Between the lower surface of Y beam 33 and the upper surface of a surface plate 12 to be described later on, a predetermined clearance is formed. More specifically, Y beam 33 and surface plate 12 are noncontact and are separated in terms of vibration.

Substrate stage device PST is equipped with surface plate 12 installed on floor surface F, a fixed-point stage 40 (see FIG. 2) that holds substrate P from below in a noncontact manner, directly under exposure area IA (see FIG. 2), a plurality of air levitation units 50 installed on surface plate 12, a substrate holding frame 60 that holds substrate P and a drive unit 70 that drives substrate holding frame 60 in the X-axis direction and the Y-axis direction (along the XY plane).

Figure 2:
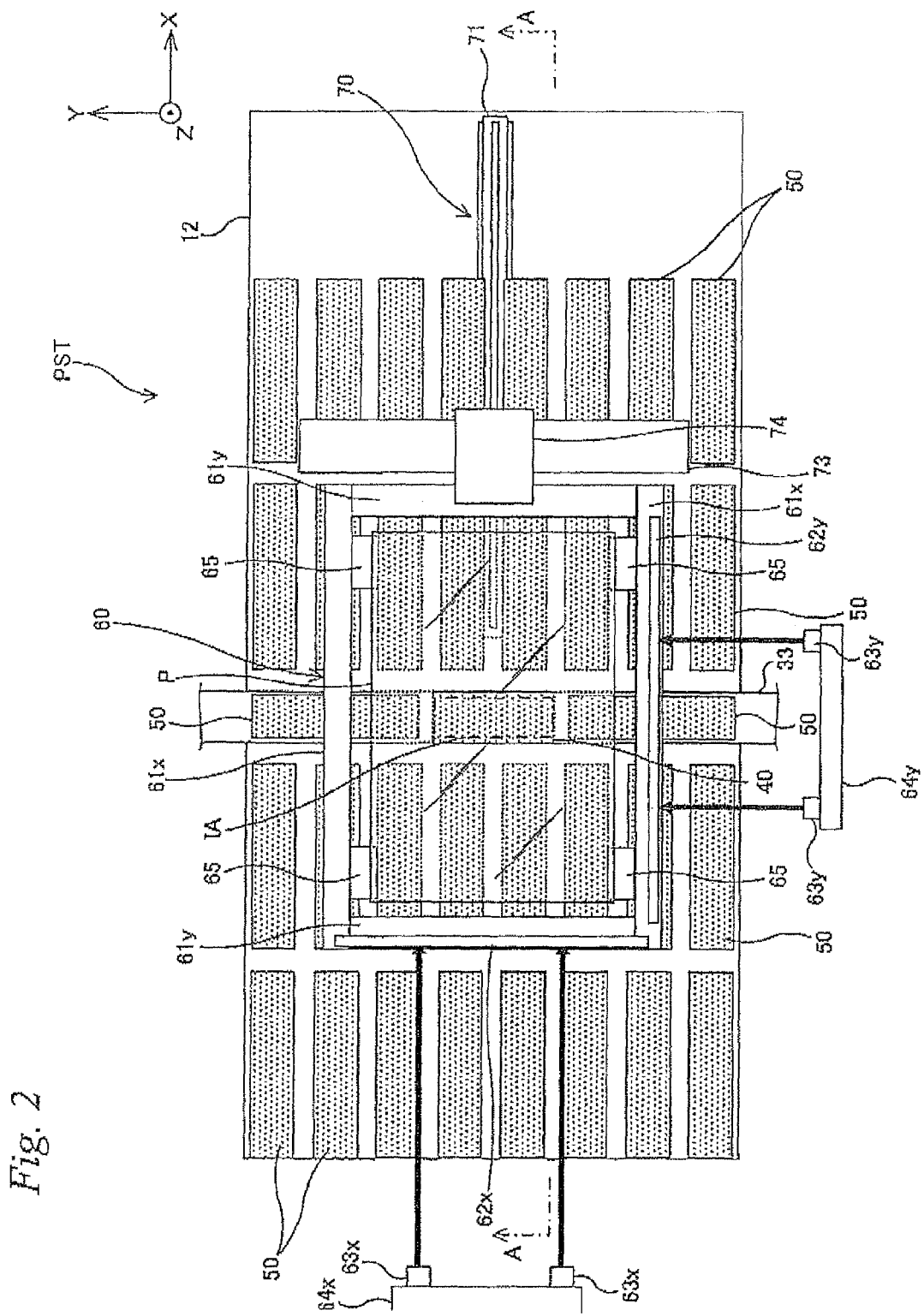
FIG. 2 is a plan view of a substrate stage device which the liquid crystal exposure apparatus of FIG. 1 has.

As shown in FIG. 2, surface plate 12 is made up of a member having a rectangular plate shape whose longitudinal direction is in the X-axis direction in a planar view (when viewed from the +Z side).

Figure 4:
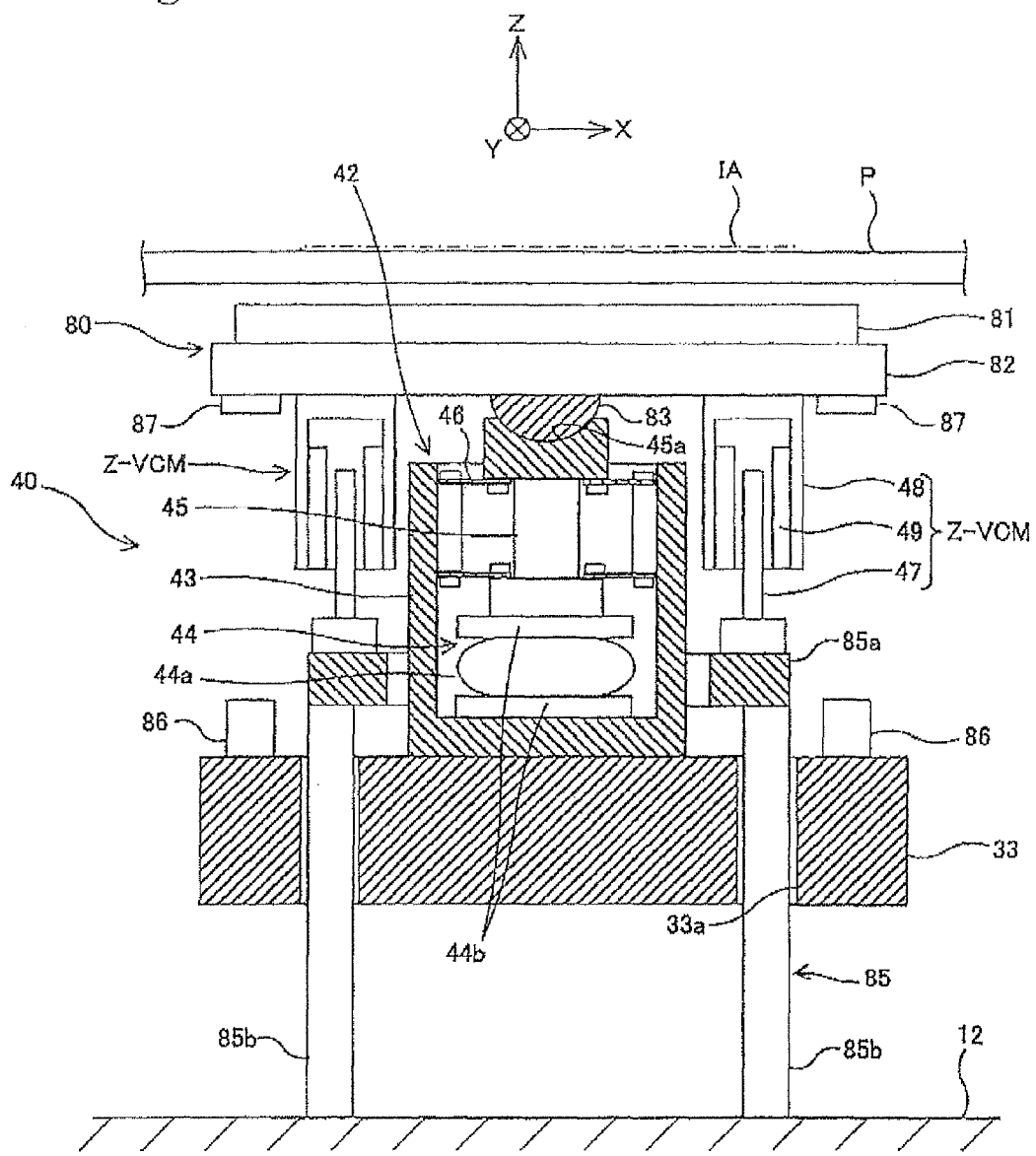
FIG. 4 is a cross-sectional view of a fixed-point stage which the substrate stage device of FIG. 2 has.

Fixed-point stage 40 is placed at a position that is slightly on the −X side from the center on surface plate 12. Further, as shown in FIG. 4, fixed-point stage 40 is equipped with a weight canceller 42 mounted on Y beam 33, a chuck member (an air chuck unit) 80 supported by weight canceller 42, an actuator used to drive air chuck unit 80 in a direction intersecting the XY plane, for example, a plurality of Z voice coil motors (hereinafter, shortly referred to as Z-VCMs), and the like.

Weight canceller 42 is equipped with a case 43, for example, fixed to Y beam 33, an air spring 44 housed in the lowermost section inside case 43, and a Z slider 45 supported by air spring 44. Case 43 is made up of a cylinder-like member having a bottom which is opened on the +Z side. Air spring 44 has a bellows 44a made up of a hollow member formed with a rubber-based material, and a pair of plates 44b (e.g. metal plates) parallel to the XY plane that is placed on (on the +Z side of) and under (on the −Z side of) bellows 44a. The inside of bellows 44a is set to be a positive pressure space whose atmospheric pressure is higher compared with the outside, because a gas is supplied from a gas supplying device that is not illustrated. Weight canceller 42 reduces the load on the plurality of Z-VCMs by cancelling out the weight (a downward force (in the −Z direction) owing to the gravitational acceleration) of substrate P, air chuck unit 80, Z slider 45 and the like with an upward force (in the +Z direction) generated by air spring 44.

Z slider 45 is made up of a columnar member arranged extending parallel to the Z-axis whose lower end is fixed to plate 44b placed on the +Z side of air spring 44. Z slider 45 is connected to the inner wall surface of case 43 via a plurality of parallel plate springs 46. Parallel plate spring 46 has a pair of plate springs parallel to the XY plane that are placed apart in the vertical direction. Parallel plate springs 46 connect Z slider 45 and case 43 at, for example, four positions in total which are positions on the +X side, the −X side, the +Y side and the −Y side of Z slider 45 (the illustration of the parallel plate springs on the +Y side and the −Y side of Z slider 95 is omitted). While relative movement of Z slider 45 with respect to case 43 in directions parallel to the XY plane is restricted owing to the stiffness (extensional stiffness) of the respective parallel plate springs 46, Z slider 45 can be relatively moved with a minute stroke with respect to case 43 in the Z-axis direction owing to the flexibility of the respective parallel plate springs 46. Consequently, Z slider 45 vertically moves with respect to Y beam 33 by the pressure of a gas within bellows 44a being adjusted. Incidentally, a member that generates an upward force used to cancel the weight of substrate P is not limited to the air spring (bellows) described above, but can be an air cylinder, a coil spring, or the like. Further, as a member that restricts the position of the Z slider within the XY plane, for example, a noncontact thrust bearing (e.g. a static gas bearing such as an air bearing) whose bearing surface is opposed to the side surface of the Z slider, or the like can also be used (refer to PCT International Publication No. 2008/129762 (the corresponding U.S. Patent Application Publication No. 2010/0018950)).

Air chuck unit 80 includes a chuck main body 81 that holds by adsorption a portion that corresponds to exposure area IA (portion subject to exposure), of substrate P in a noncontact manner from the lower surface side of substrate P, and a base 82 that supports chuck main body 81 from below. The upper surface (the surface on the +Z side) of chuck main body 81 has a rectangular shape with the Y-axis direction serving as its longitudinal direction in a planar view (see FIG. 2), and the center of the upper surface roughly coincides with the center of exposure area IA. Further, the area size of the upper surface of chuck main body 81 is set larger than exposure area IA, and especially the size in the X-axis direction that is the scan direction is set longer than the size of exposure area IA in the X-axis direction.

Chuck main body 81 has a plurality of gas jetting ports, which are not illustrated, on its upper surface, and supports substrate P by levitation by jetting a gas supplied from the gas supplying device that is not illustrated, for example, a high-pressure gas toward the lower surface of substrate P. Furthermore, chuck main body 81 has a plurality of gas suctioning ports, which are not illustrated, on the upper surface. A gas suctioning device (vacuum device) that is not illustrated is connected to chuck main body 81, and the gas suctioning device suctions the gas between the upper surface of chuck main body 81 and the lower surface of substrate P via the gas suctioning ports of chuck main body 81, and generates the negative pressure between chuck main body 81 and substrate P. Air chuck unit 80 holds substrate P by adsorption in a noncontact manner using a balance between the pressure of the gas jetted from chuck main body 81 to the lower surface of substrate P and the negative pressure generated when the gas between chuck main body 81 and the lower surface of substrate P is suctioned. In this manner, since air chuck unit 80 places so-called preload on substrate P, the stiffness of the gas (air) membrane formed between chuck main body 81 and substrate P can be increased, and accordingly, even if substrate P has deformation or warpage, the portion subject to exposure, which is located directly under projection optical system PL, of substrate P can surely be redressed along the holding surface of chuck main body 81. However, since air chuck unit 80 does not restrict the position of substrate P within the XY plane, substrate P can relatively move in each of the X-axis direction (scan direction) and the Y-axis direction (step direction) with respect to illumination light IL (see FIG. 1) even if substrate P is in a state held by adsorption by air chuck unit 80.

Figure 5A:
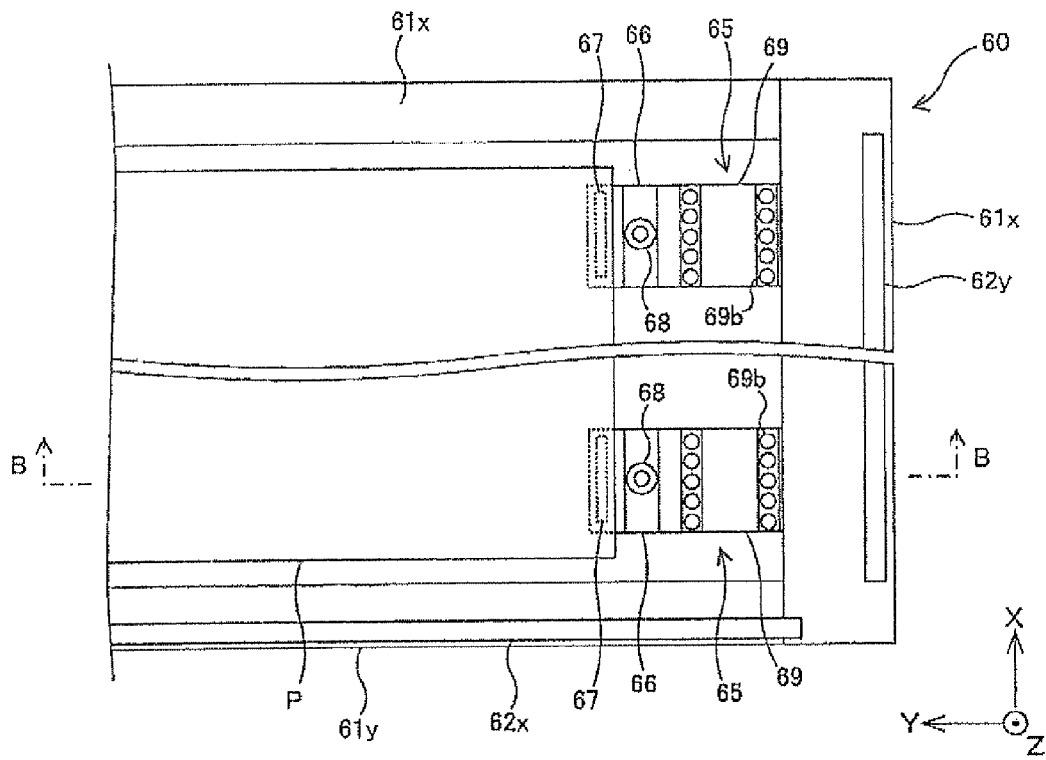
FIG. 5A is a plan view enlargedly showing a part of a substrate holding frame which the substrate stage device of FIG. 2 has.
Figure 5B:
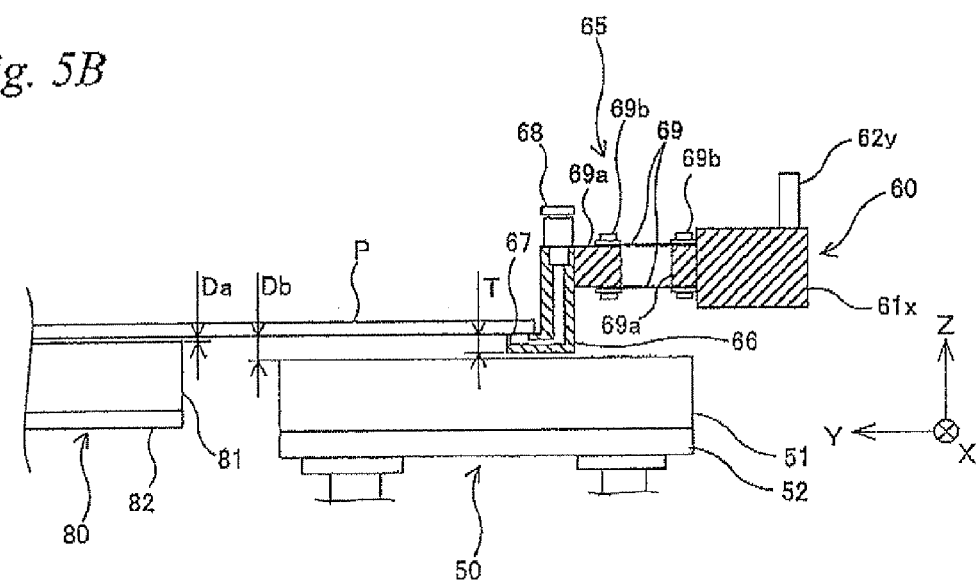
FIG. 5B is a cross-sectional view taken along the line B-B of FIG. 5A.

As shown in FIG. 5B, in this embodiment, the flow rate or the pressure of the gas jetted from the upper surface of chuck main body 81 and the flow rate or the pressure of the gas suctioned by the gas suctioning device are set such that a distance Da (clearance) between the upper surface (substrate holding surface) of chuck main body 81 and the lower surface of substrate P is, for example, around 0.02 mm. Incidentally, the gas jetting ports and the gas suctioning ports can be formed by the mechanical processing, or chuck main body 81 is formed with a porous material and its holes can be used as the gas jetting ports and the gas suctioning ports. The details of the configuration and the functions of this type of the air chuck unit (vacuum preload air bearing) are disclosed in, for example, PCT International Publication No. 2008/121561 and the like.

Referring back to FIG. 4, in the center of the lower surface of base 82, a static gas bearing having a semispherical-shaped bearing surface, e.g. a spherical air bearing 83 is fixed. Spherical air bearing 83 is fitted into a concave section 45a having a semispherical shape that is formed on the end surface on the +Z side (upper surface) of Z slider 45. Accordingly, air chuck unit 80 is supported, by Z slider 45, swingably with respect XY plane (rotatably in the θx and θy directions). Incidentally, as a structure that supports air chuck unit 80 swingably with respect to the XY plane, a quasi-spherical bearing structure that uses a plurality of air pads (air bearings) that is disclosed in, for example, PCT International Publication No. 2008/129762 (the corresponding U.S. Patent Application Publication No 2010/0018950) can also be employed, or an elastic hinge device can also be used.

Figure 3:
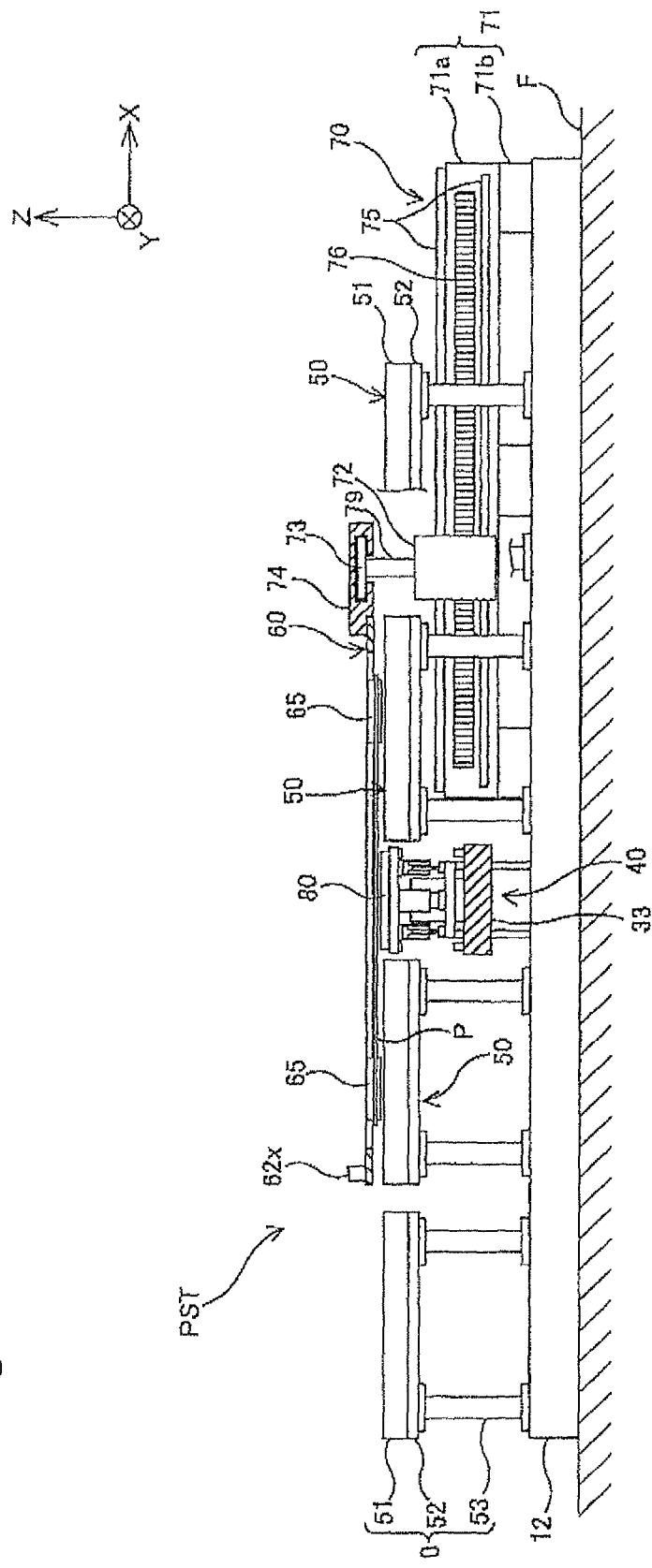
FIG. 3 is a cross-sectional view taken along the line A-A of FIG. 2.

One each of a plurality, four in this embodiment, of the Z-VCMs is arranged on the +X side, the −X side, the +Y side and the −Y side of weight canceller 42 (as for the Z-VCM on the −Y side, see FIG. 3, and the illustration of the Z-VCM on the +Y side is omitted). The four Z-VCMs have the same configuration and functions except that their setting positions are different. Each of the four Z-VCMs includes a Z stator 47 fixed to a base frame 85 installed on surface plate 12 and a Z mover 48 fixed to base 82 of air chuck unit 80.

Base frame 85 includes a main section 85a made up of a plate-shaped member formed so as to have an annular shape in a planar view and a plurality of leg sections 85b that support main section 85a from below on surface plate 12. Main section 85a is placed above Y beam 33 and weight canceller 42 is inserted in an opening section formed in the center portion of main section 85a. Therefore, main section 85a is noncontact with each of Y beam 33 and weight canceller 42. Each of the plurality (three or more, in this case) of leg sections 85b is made up of a member arranged extending parallel to the Z-axis, and the +Z side end of leg section 85b is connected to main section 85a and the −Z side end is fixed to surface plate 12. The plurality of leg section 85b are respectively inserted in a plurality of through-holes 33a, which are formed in Y beam 33 so as to respectively correspond to the plurality of leg sections 85b and which penetrate in the Z-axis direction, and the plurality of leg section 85b are noncontact with Y beam 33.

Z mover 48 is made up of a member having an inverse U-like sectional shape and has a magnetic unit 49 including magnets on each of a pair of opposed surfaces. Meanwhile, Z stator 47 has a coil unit including coils (the illustration is omitted) and the coil unit is inserted between a pair of magnetic units 49. The magnitude and the direction of the electric current supplied to the coils of Z stator 47 are controlled by a main controller that is not illustrated, and when the electric current is supplied to the coils of the coil unit, Z mover 48 (i.e. air chuck unit 80) is driven with respect to Z stator 47 (i.e. base frame 85) in the Z-axis direction by the electromagnetic force (Lorentz force) generated by the electromagnetic interaction between the coil unit and the magnetic units. The main controller, which is not illustrated, drives (vertically moves) air chuck unit 80 in the Z-axis direction by synchronously controlling the four Z-VCMs. Further, the main controller swings air chuck unit 80 in arbitrary directions with respect to the XY plane (drives air chuck unit 80 in the θx direction and the θy direction) by appropriately controlling the magnitude and the direction of the electric current supplied to each of the coils that the four Z stators 47 have. With this operation, fixed-point stage 40 adjusts at least one position of the position in the Z-axis direction and the position in the θx and the θy directions of the portion subject to exposure of substrate P. Incidentally, while each of the X-axis VCMs, the Y-axis VCMs and the Z-axis VCM in the present embodiment is a voice coil motor by a moving magnet type in which the mover has the magnetic unit, this is not intended to be limiting, and each of the VCMs can be a voice coil motor by a moving coil type in which the mover has the coil unit. Further, the drive method can be drive methods other than the Lorentz force drive method.

In this case, since Z stator 47 of each of the four Z-VCMs is mounted on base frame 85, the reaction force of the drive force which acts on Z stator 47 when air chuck unit 80 is driven in the Z-axis direction, or the θx direction and the θy direction using the four Z-VCMs is not transmitted to Y beam 33. Consequently, when air chuck unit 80 is driven using the Z-VCMs, the operation of weight canceller 42 is not affected at all. Further, because the reaction force of the drive force is not transmitted to body BD that has Y beam 33 as well, the reaction force of the drive force does not affect projection optical system PL and the like when air chuck unit 80 is driven using the Z-VCMs. Incidentally, the number of the Z-VCMs can be three if the three Z-VCMs are arranged, for example, at three noncollinear positions, because the Z-VCMs only should vertically move air chuck unit 80 along the Z-axis direction and swing the air chuck unit in arbitrary directions with respect to the XY plane.

Positional information of air chuck unit 80 that is driven by the Z-VCMs is obtained using a plurality, e.g. four in the embodiment, of Z sensors 86. One each of Z sensors 86 is arranged on the +X side, the −X side, the +Y side and the −Y side of weight canceller 42 so as to correspond to the four Z-VCMs (the illustration of the Z sensors on the +Y side and on the −Y side are omitted). Accordingly, in the present embodiment, the drive point (the point of action of the drive force) by the Z-VCMs on a driven object (in this case, air chuck unit 80) that is driven by the Z-VCMs and the measurement points by Z sensors 86 are made to be closely arranged, and thereby the stiffness of the driven object between the measurement points and the drive point is increased, which increases the controllability of Z sensors 86. More specifically, Z sensors 86 output the accurate measurement values that correspond to the drive distance by the driven object, thereby decreasing the positioning time. It is desirable for Z sensors 86 to have a short sampling period, from the viewpoint of increasing the controllability.

The four Z sensors 86 are substantially the same sensors. Z sensor 86 configures, together with a target 87 fixed to the lower surface of base 82 of air chuck unit 80, a position sensor by, for example, a capacitance method (or an eddy current method) that obtains the positional information of air chuck unit 80 in the Z-axis direction with Y beam 33 serving as a reference. The main controller, which is not illustrated, constantly obtains positional information of air chuck unit 80 in the Z-axis direction and each of the θx and θy directions based on the outputs of the four Z sensors 86, and controls the position of the upper surface of air chuck unit 80 by appropriately controlling the four Z-VCMs based on the measurement values. In this case, the final position of air chuck unit 80 is controlled such that the exposure surface (e.g. the resist surface to be the upper surface) of substrate P that passes close to above air chuck unit 80 substantially coincides with the focal position of projection optical system PL (i.e. is within a depth of focus of projection optical system PL) at all times. While monitoring the position of the upper surface (the surface position) of substrate P with a surface position measuring system (autofocus device) that is not illustrated, the main controller, which is not illustrated, drives and controls air chuck unit 80 using the positional information from Z sensors 86 that have high controllability such that the upper surface of substrate P is constantly located within a depth of focus of projection optical system PL (such that projection optical system PL is focused on the upper surface of substrate P at all times). In this case, the surface position measuring system (autofocus device) has a plurality of measurement points whose positions in the Y-axis direction are different within exposure area IA. For example, at least one measurement point is placed in each projection area. In this case, the plurality of measurement points are placed in two rows spaced apart in the X-axis direction, in accordance with the zigzag-shaped placement of the plurality of projection areas. Consequently, based on the measurement values of the plurality of measurement points (the surface positions), the pitching amount (θy rotation) and the rolling amount (θx rotation) of substrate P can be obtained, in addition to the Z-position of the substrate P surface of exposure area IA portion. Further, the surface position measuring system can have a measurement point on the outer side of exposure area IA in the Y-axis direction (non-scanning direction), separately from or in addition to the plurality of measurement points. In this case, by using the measurement values of the two measurement points located outermost in the Y-axis direction that include the measurement point located on the outer side, it becomes possible to more accurately obtain the rolling amount (θx rotation). Further, the surface position measuring system can have another measurement point at a position slightly away in the X-axis direction (scanning direction) on the outer side of exposure area IA. In this case, so-called read-ahead control of focus/leveling of substrate P becomes possible. Besides, instead of or in addition to the plurality of measurement points at least one of which is placed in each projection area, the surface position measuring system can have a plurality of measurement points disposed in the Y-axis direction at positions away from exposure area IA in the X-axis direction (scanning direction) (the placement area of such plurality of measurement points corresponds to the position of exposure area IA in the Y-axis direction). In such a case, it becomes possible to perform the focus mapping that acquires the distribution of surface position of substrate P in advance, prior to exposure start, for example, during alignment measurement. During the exposure, the focus/leveling control of substrate P is performed using information obtained in the focus mapping. The focus mapping of a substrate and focus/leveling control of the substrate during exposure using the information of the focus mapping are disclosed in detail in, for example, U.S. Patent Application Publication No. 2008/0088843 and the like.

Incidentally, the number of the Z sensors can be three if the three Z sensors are arranged, for example, at three noncollinear positions, because the Z sensors only should obtain positional information of air chuck unit 80 in the Z-axis direction and each of the θx and θy directions.

The plurality of air levitation units 50 (e.g. 34 units in this embodiment) prevent the vibration from the outside from being transmitted to substrate P, preventing substrate P from deforming (bending) and breaking because of the self weight, restraining occurrence of size error in each of the X and Y directions (or positional deviation within the XY plane) of substrate P that is caused by bending of substrate P in the Z-axis direction because of the self weight, and so on, by supporting substrate P (in this case, an area excluding the portion subject to exposure of substrate P that is held by fixed-point stage 40 described previously) from below in a noncontact manner such that substrate P is maintained roughly parallel to a horizontal plane.

The plurality of air levitation units 50 are substantially the same air levitation units except that their placement positions are different. In the present embodiment, as shown in FIG. 2, for example, one each of air levitation unit 50 is placed on the +Y side and the −Y side of fixed-point stage 40, and two rows of air levitation unit rows, each of which is composed of, for example, eight air levitation units 50 disposed at an equal distance along the Y-axis direction, are placed at a predetermined distance along the X-axis direction on each of the +X side and the −X side of fixed-point stage 40. More specifically, the plurality of air levitation units 50 are placed so as to enclose the periphery of fixed-point stage 40. In the description below, the explanation is given assuming that the four rows of the air levitation unit rows are referred to as the first to fourth rows starting from the −X side for the sake for convenience, and the eight air levitation units that configure each air levitation unit row are referred to as the first to eighth units starting from the −Y side for the sake for convenience.

As shown in FIG. 3, each of air levitation units 50 includes, for example, a main section 51 that jets a gas (e.g. air) to the lower surface of substrate P, a support section 52 that supports main section 51 from below, and a pair of leg sections 53 that support support section 52 from below on surface plate 12. Main section 51 is made up of a member having a rectangular parallelepiped shape and has a plurality of gas jetting ports on its upper surface (the surface on the +Z side). Main section 51 supports substrate P by levitation by jetting the gas (air) toward the lower surface of substrate P, and guides movement of substrate P when substrate P moves along the XY plane. The upper surface of each of the plurality of air levitation units 50 is located on the same XY plane. Incidentally, the air levitation unit can be configured such that the gas is supplied from a gas supplying device, which is not illustrated, arranged outside, or the air levitation unit itself can have a blower, e.g. a fan or the like. In this embodiment, as shown in FIG. 5B, the pressure and the flow rate of the gas jetted from main section 51 are set such that a distance Db (clearance) between the upper surface (air jetting surface) of main section 51 and the lower surface of substrate P is, for example, around 0.8 mm. Incidentally, the gas jetting ports can be formed by the mechanical processing or the main section is formed with a porous material and its holes can be used as the gas jetting ports.

Support section 52 is made up of a plate-shaped member having a rectangular shape in a planar view, and its lower surface is supported by the pair of leg sections 53. Incidentally, the leg sections of a pair (two) of air levitation units 50 arranged on the +Y side and the −Y side of fixed-point stage 40, respectively, are configured so as not to come in contact with Y beam 33 (e.g. the leg sections are each formed into an inverse U-like shape and placed astride Y beam 33). Incidentally, the number and the placement of the plurality of the air levitation units are not limited to those described above as examples, and the number and the placement can appropriately be changed in accordance with, for example, the size, shape, weight and movable range of substrate P or the capability of each air levitation unit, or the like. Further, the shape of the support surface (gas jetting surface) of each of the air levitation units, the distance between the adjacent air levitation units and the like are also not limited in particular. The point is that the air levitation units should be placed so as to cover the entire area of a movable range where substrate P can move (or an area slightly larger than the movable range).

As shown in FIG. 2, substrate holding frame 60 has a rectangular outer shape (contour) with the X-axis direction serving as its longitudinal direction in a planar view, and is formed into a frame shape having the size in the thickness direction is small (thin) that has an opening section, in the center portion, having a rectangular shape in a planar view that penetrates in the Z-axis direction. Substrate holding frame 60 has a pair of X frame members 61x, each of which is a tabular member parallel to the XY plane with the X-axis direction serving as its longitudinal direction, at a predetermined distance in the Y-axis direction, and the +X side ends of the pair of X frame members 61x are connected and the −X side ends of the pair of X frame members 61x are connected, respectively, by a Y frame member 61y that is a tabular member parallel to the XY plane with the Y-axis direction serving as its longitudinal direction. It is preferable from the viewpoint of securement of stiffness and reduction in weight that each of the pair of X frame members 61x and a pair of Y frame members 61*y* is formed with a material such as a fiber reinforcing synthetic resin material such as GFRP (Glass Fiber Reinforced Plastics) or ceramics.

On the upper surface of X frame member 61*x* on the −Y side, a Y movable mirror 62*y* having a reflection surface orthogonal to the Y-axis on its −Y side surface is fixed. And, on the upper surface of Y frame member 61*y* on the −X side, an X movable mirror 62*x* having a reflection surface orthogonal to the X-axis on its −X side surface is fixed. Positional information within the XY plane (including rotational information in the θz direction) of substrate holding frame 60 (i.e. substrate P) is constantly detected at a resolution of, for example, around 0.25 nm with a laser interferometer system that includes a plurality, e.g. two, of X laser interferometers 63*x* that irradiate the reflection surface of X movable mirror 62*x* with measurement beams and a plurality, e.g. two, of Y laser interferometers 63*y* that irradiate the reflection surface of Y movable mirror 62*y* with measurement beams. X laser interferometers 63*x* and Y laser interferometers 63*y* are fixed to body BD (not illustrated in FIG. 3, see FIG. 1) via predetermined fixing members 64*x* and 64*y*, respectively. Incidentally, the number of X laser interferometers 63*x* and the distance therebetween, and the number of Y laser interferometers 63*y* and the distance therebetween are set such that the measurement beam from at least one interferometer of the respective interferometers is irradiated on the corresponding movable mirror within the movable range where substrate holding frame 60 is movable. Consequently, the number of the respective interferometers is not limited to two, but for example, can be one, or three or more, depending on the movement stroke of the substrate holding frame. Further, in the case of using a plurality of measurement beams, it is also possible that a plurality of optical systems are provided and the light source and the control unit are shared by the plurality of measurement beams.

Substrate holding frame 60 has a plurality, e.g. four, of holding units 65 that hold the end (the outer peripheral portion) of substrate P by vacuum adsorption from below. Two each of the four holding units 65 are attached to the opposed surfaces of the pair of X frame members 61*x* that are opposed to each other, so as to be spaced apart in the X-axis direction. Incidentally, the number and the placement of the holding units are not limited to those described above, but the extra holding unit(s) can be additionally arranged as needed, for example, in accordance with the size and the vulnerability to bending of a substrate, and the like. Further, holding units 65 can be attached to the Y frame members.

As can be seen from FIGS. 5A and 5B, holding unit 65 has a hand 66 that is formed so as to have an L-like YZ sectional shape. On the substrate mounting surface of hand 66, an adsorption pad 67 used to adsorb substrate P by, for example, vacuum adsorption is arranged. Further, on the upper end of hand 66, a joint member 68 is arranged, to which one end of a tube (the illustration is omitted) is connected while the other end of the tube is connected to a vacuum device that is not illustrated. Adsorption pad 67 and joint member 68 communicate with each other via a piping member arranged inside hand 66. On each of the surface of hand 66 and the surface of X frame member 61*x* that are opposed to each other, protrusion section 69*a* that protrudes is formed, and between the pair of protrusion sections 69*a* that are opposed to each other, a pair of plate springs 69 that are parallel to the XY plane and spaced apart in the Z-axis direction are installed via a plurality of bolts 69*b*. More specifically, hand 66 and X frame member 61*x* are connected by the parallel plate springs Consequently, the position of hand 66 is restricted in the X-axis direction and the Y-axis direction with respect to X frame member 61*x* owing to the stiffness of plate springs 69, and on the other hand, regarding the Z-axis direction (vertical direction), hand 66 can be displaced in the Z-axis direction (can vertically move) without rotating in the θx direction owing to the elasticity of plate springs 69.

Figure 6A:
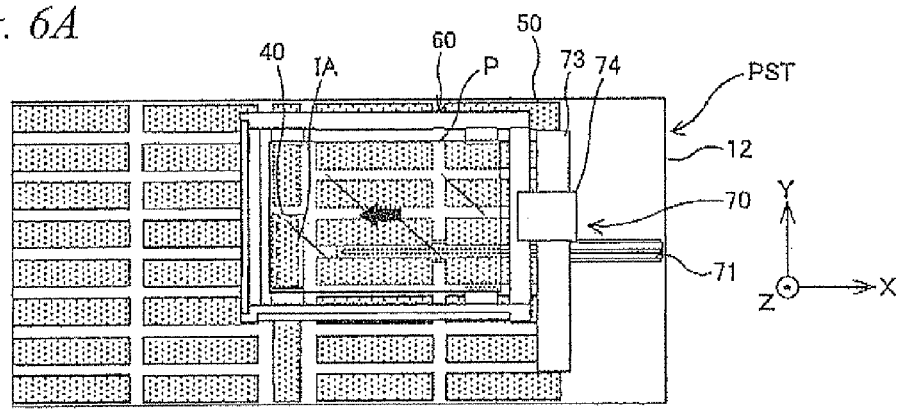
FIGS. 6A to 6C are views used to explain an operation of the substrate stage device when exposure processing is performed on a substrate.
Figure 6B:
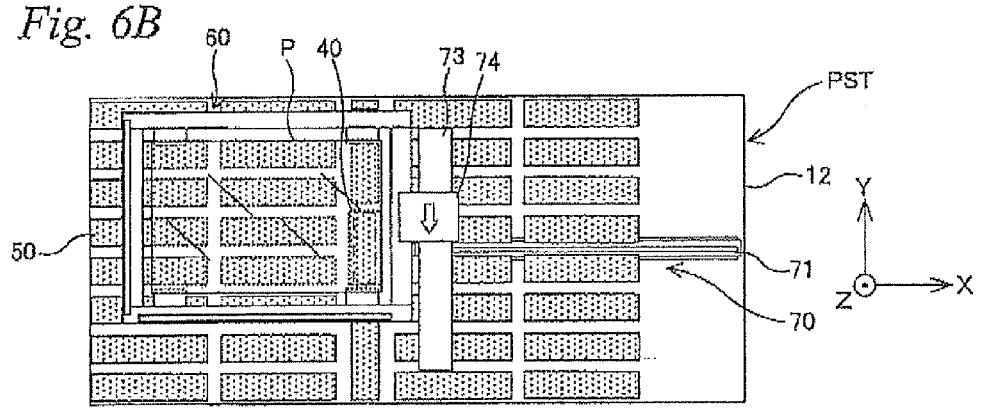
Figure 6C:
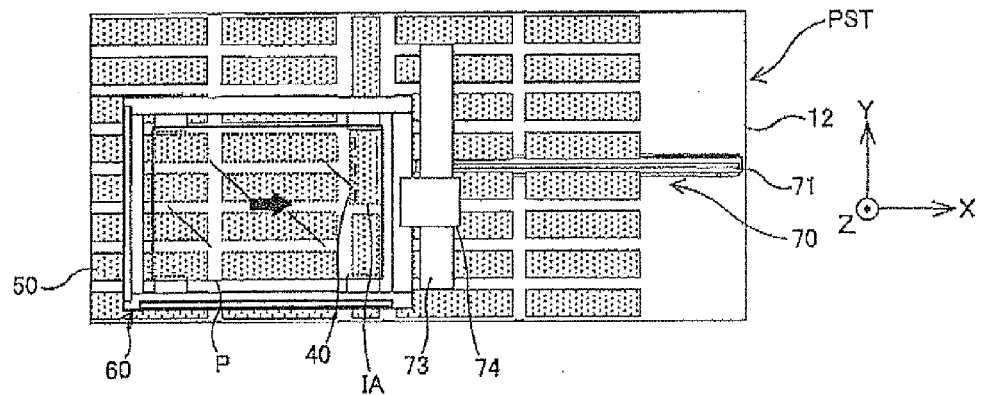

In this case, the lower end surface (−Z side end surface) of hand 66 protrudes on the −Z side, below the lower end surface (−Z side end surface) of each of the pair of the X frame members 61*x* and the pair of the Y frame members 61*y*. However, a thickness T of the substrate mounting surface of hand 66 is set less (e.g. set to around 0.5 mm) than distance Db (e.g. around 0.8 mm in the present embodiment) between the gas jetting surfaces of air levitation units 50 and the lower surface of substrate P. Therefore, a clearance of, for example, around 0.3 mm is formed between the lower surface of the substrate mounting surface of hand 66 and the upper surfaces of the plurality of air levitation units 50, and when substrate holding frame 60 moves parallel to the XY plane above the plurality of air levitation units 50, hand 66 and air levitation units 50 do not come in contact. Incidentally, as shown in FIGS. 6A to 6C, during an exposure operation of substrate P, hand 66 does not passes above fixed-point stage 40, and therefore, hand 66 and air chuck unit 80 do not come in contact as well. Incidentally, the substrate mounting surface section of hand 66 has a low stiffness in the Z-axis direction because the substrate mounting surface is thin as described above, but the area size of a portion that comes in contact with substrate P (flat portion parallel to the XY plane) can be large, and accordingly the adsorption pad can be increased in size, which improves the adsorption force of the substrate. Further, the stiffness of the hand itself in directions parallel to the XY plane can be secured.

As shown in FIG. 3, drive unit 70 has an X guide 71 fixed on surface plate 12, an X movable section 72 that is mounted on X guide 71 and is movable in the X-axis direction on X guide 71, a Y guide 73 mounted on X movable section 72, and a Y movable section 74 that is mounted on Y guide 73 and is movable in the Y-axis direction on Y guide 73. Y frame member 61*y* on the +X side of substrate holding frame 60 is fixed to Y movable section 74, as shown in FIG. 2.

As shown in FIG. 2, X guide 71 is placed on the −X side of fixed-point stage 40, between the fourth air levitation units 50 and the fifth air levitation units 50 that configure the third and the fourth air levitation unit rows. Further, X guide 71 extends on the +X side beyond the fourth air levitation unit row. Incidentally, in FIG. 3, from the viewpoint of preventing intricacy of the drawing, the illustration of air levitation units 50 is partially omitted. X guide 71 has a main section 71*a* made up of a plate-shaped member parallel to the XZ plane with the X-axis direction serving as its longitudinal direction and a plurality, e.g. three, of support tables 71*b* that support main section 71*a* on surface plate 12 (see FIG. 1). The position in the Z-axis direction of main section 71*a* is set such that the upper surface of main section 71*a* is located lower than the respective support sections 52 of the plurality of air levitation units 50.

On each of the side surface on the +Y side, the side surface on the −Y side and the upper surface (the surface on the +Z side) of main section 71*a*, as shown in FIG. 1, an X linear guide 75 arranged extending parallel to the X-axis direction is fixed. Further, on each of the side surface on the +Y side and the side surface on the −Y side of main section 71*a*, a magnetic unit 76 including a plurality of magnets disposed along the X-axis direction is fixed (see FIG. 3).

As shown in FIG. 1, X movable section 72 is made up of a member having an inverse U-like YZ sectional shape, and X guide 71 described earlier is inserted between a pair of opposed surfaces of the member. On each of the inner side surfaces (the ceiling surface and the pair of opposed surfaces that are opposed to each other) of X movable section 72, a slider 77 formed so as to have a U-like sectional shape is fixed. Slider 77 has a rolling element (e.g. a ball, a skid or the like) that is not illustrated, and is engaged with (fitted into) X linear guide 75 in a slidable state with respect to X linear guide 75. Further, on each of the pair of opposed surfaces of X movable section 72, a coil unit 78 including coils is fixed so as to be opposed to magnetic unit 76 fixed to X guide 71. A pair of coil units 78 configure an X linear motor by the electromagnetic force drive method that drives X movable section 72 in the X-axis direction on X guide 71 owing to the electromagnetic interaction with a pair of magnetic units 76. The magnitude and the direction of the electric current supplied to the coils of coil units 78 are controlled by the main controller that is not illustrated. Positional information of X movable section 72 in the X-axis direction is measured by a linear encoder system or an optical interferometer system, which is not illustrated, with high precision.

On the upper surface of X movable section 72, one end (lower end) of a shaft 79 parallel to the Z-axis is fixed. As shown in FIG. 1, shaft 79 passes between the fourth air levitation unit 50 and the fifth air levitation unit 50 that configure the fourth air levitation unit row and extends on the +Z side beyond the upper surfaces (gas jetting surfaces) of the respective air levitation units 50. The other end (upper end) of shaft 79 is fixed to the center of the lower surface of Y guide 73 (see FIG. 3). Consequently, Y guide 73 is placed higher than the upper surfaces of air levitation units 50. Y guide 73 is made up of a plate-shaped member with the Y-axis direction serving as its longitudinal direction, and has a magnetic unit, which is not illustrated, including a plurality of magnets disposed along the Y-axis direction inside thereof. In this case, since Y guide 73 is placed above the plurality of air levitation units 50, the lower surface of Y guide 73 is supported by the air jetted from air levitation units 50, and accordingly, for example, the both ends of Y guide 73 in the Y-axis direction are prevented from bending downward because of the self weight. Consequently, the stiffness to prevent the downward bending referred to above needs not be secured, which allows reduction in weight of Y guide 73.

As shown in FIG. 3, Y movable section 74 is made up of a box-shaped member with a size in the height direction that is small (thin) having a space inside, and on the lower surface of Y movable section 74, an opening section that allows shaft 79 to pass through is formed. Further, Y movable section 74 has an opening section on the side surfaces on the +Y side and the −Y side as well, and Y guide 73 is inserted into Y movable section 74 via the opening sections. Further, Y movable section 74 has noncontact thrust bearings, which are not illustrated, e.g. air bearings, on the opposed surfaces opposed to Y guide 73, and Y movable section 74 is movable in the Y-axis direction above Y guide 73 in a noncontact state. Since substrate holding frame 60 to hold substrate P is fixed to Y movable section 74, substrate holding frame 60 is in a noncontact state with respect to fixed-point stage 40 described previously and each of the plurality of air levitation units 50.

Furthermore, Y movable section 74 has a coil unit including coils (the illustration is omitted) inside thereof. The coil unit configures a Y linear motor by the electromagnetic force drive method that drives Y movable section 74 in the Y-axis direction above Y guide 73 owing to the electromagnetic interaction with the magnetic unit that Y guide 73 has. The magnitude and the direction of the electric current supplied to the coils of the coil unit are controlled by the main controller that is not illustrated. Positional information of Y movable section 74 in the Y-axis direction is measured by a linear encoder system or an optical interferometer system, which is not illustrated, with high precision. Incidentally, each of the X linear motor and the Y linear motor described above is either of the moving magnet type or the moving coil type, and the drive method is not limited to the Lorentz force drive method but can be other methods such as a variable magnetoresistance drive method. Further, as a drive device that drives the X movable section described above in the X-axis direction and a drive device that drives the Y movable section described above in the Y-axis direction, for example, a uniaxial drive device can be used that includes a ball screw, a rack-and-pinion or the like, or a device can be used that drives the X movable section and the Y movable section in the X-axis direction and the Y-axis direction, respectively, by towing the X movable section and the Y movable section using a wire, a belt or the like, for example, according to the required accuracy of positioning of substrates, the throughput, the movement stroke of substrates, and the like.

Besides, liquid crystal exposure apparatus 10 has a surface position measuring system (the illustration is omitted) that measures surface position information (positional information in each of the Z-axis, θx and θy directions) of the surface (upper surface) of substrate P located directly under projection optical system PL. As the surface position measuring system, the one by an oblique incidence method as disclosed in, for example, U.S. Pat. No. 5,448,332 and the like can be used.

In liquid crystal exposure apparatus 10 (see FIG. 1) configured as described above, under control of the main controller that is not illustrated, mask M is loaded onto mask stage MST by a mask loader that is not illustrated and substrate P is loaded onto substrate stage device PST by a substrate loader that is not illustrated. After that, the main controller executes alignment measurement using an alignment detection system that is not illustrated, and after the alignment measurement is completed, performs an exposure operation by a step-and-scan method.

FIGS. 6A to 6C show an example of an operation of substrate stage device PST during the exposure operation referred to above. Note that in the description below, the case of so-called two displays on a single substrate is described where one each of a rectangular shot area whose longitudinal direction is in the X-axis direction is set in an area on the +Y side and an area on the −Y side of substrate P. As shown in FIG. 6A, the exposure operation is performed from an area on the −Y side located on the −X side of substrate P toward an area on the −Y side located on the +X side of substrate P. On this operation, X movable section 72 (see the drawings such as FIG. 1) of drive unit 70 is driven in the −X direction on X guide 71, and thereby substrate P is driven in the −X direction (see a black arrow in FIG. 6A) with respect to exposure area IA and a scan operation (exposure operation) is performed on an area on the −Y side of substrate P. Subsequently, on substrate stage device PST, as shown in FIG. 6B, Y movable section 74 of drive unit 70 is driven in the −Y direction (see a white arrow in FIG. 6B)) above Y guide 73, and thereby a step operation is performed. After that, as shown in FIG. 6C, X movable section 72 (see the drawings such as FIG. 1) of drive unit 70 is driven in the +X direction on X guide 71, and thereby substrate P is driven in the +X direction (see a black arrow in FIG. 6C) with respect to exposure area IA and a scan operation (exposure operation) is performed on an area on the +Y side of substrate P.

In the middle of the exposure operation by a step-and-scan method shown in FIGS. 6A to 6C, the main controller constantly measures positional information of substrate P within the XY plane and surface position information of a portion subject to exposure of the substrate P surface using the interferometer system and the surface position measuring system, and appropriately controls the four Z-VCMs based on the measurement values, thereby adjusting (positioning) the surface position (the position in the Z-axis direction and each of the θx and θy directions) of a section held by fixed-point stage 40, or more specifically, the surface position of the portion subject to exposure that is located directly under projection optical system PL such that the surface position is located within a depth of focus of projection optical system PL. Accordingly, in substrate stage device PST that liquid crystal exposure apparatus 10 of the present embodiment has, for example, even if the surface of substrate P has undulation or substrate P has error in thickness, the surface position of the portion subject to exposure of substrate P can surely be located within a depth of focus of projection optical system PL, which makes it possible to improve the exposure accuracy.

Further, when the surface position of substrate P is adjusted by fixed-point stage 40, hand 66 of substrate holding frame 60 is displaced in the Z-axis direction, following the operation (a movement in the Z-axis direction or a tilt operation) of substrate P. Accordingly, damage of substrate P, a shift (adsorption error) between hand 66 and substrate P, or the like is prevented. Incidentally, since the plurality of air levitation units 50 levitate substrate P higher compared with air chuck unit 80, the air stiffness between substrate P and the plurality of air levitation units 50 is lower compared with the air stiffness between air chuck unit 80 and substrate P. Consequently, substrate P can change its attitude without difficulty above the plurality of air levitation units 50. Further, if the amount of the attitude change of substrate P is large and hand 66 cannot follow substrate P, the adsorption error referred to above or the like can be avoided by the attitude of substrate holding frame 60 itself changing, since Y movable section 74 to which substrate holding frame 60 is fixed is supported by Y guide 73 in a noncontact manner. Incidentally, a configuration can also be employed in which the stiffness of the fastening section between Y guide 73 and X movable section 72 is lowered and the attitude of Y guide 73 as a whole changes together with substrate holding frame 60.

Further, in substrate stage device PST, substrate P that is substantially horizontally supported by levitation with the plurality of air levitation units 50 is held by substrate holding frame 60. Then, in substrate stage device PST, substrate holding frame 60 is driven by drive unit 70, and thereby substrate P is guided along a horizontal plane (the XY two-dimensional plane) and also the surface position of the portion subject to exposure of substrate P (a part of substrate P, within exposure area IA) is controlled by fixed-point stage 40 in a pinpoint manner. As described above, in substrate stage device PST, drive unit 70 (XY stage device) that is a device to guide substrate P along the XY plane, and the plurality of air levitation units 50 and fixed-point stage 40 (Z/leveling stage device) that are devices to hold substrate P substantially horizontally and to position substrate P in the Z-axis direction are of different bodies that are independent from each other, and therefore, the weight of substrate stage device PST (especially, the weight of its movable section) can be considerably reduced, compared with a conventional stage device (e.g. refer to PCT International Publication No. 2008/129762 (the corresponding U.S. Patent Application Publication No. 2010/0018950))) that drives a table member (substrate holder) used to hold substrate P with a good flatness degree, having an area size that is around the same as an area size of substrate P, in the Z-axis direction and the tilt direction respectively (the Z/leveling stage is also driven XY-two-dimensionally together with the substrate), on an XY two-dimensional stage device. To be specific, for example, in the case of using a large substrate one side of which exceeds 3 m, the total weight of the movable section amounts to nearly 10 t in the conventional stage device, whereas the total weight of the movable section (such as substrate holding frame 60, X movable section 72, Y guide 73 and Y movable section 74) can be reduced to around several hundreds kg in substrate stage device PST of the present embodiment. Consequently, for example, each of the X linear motor used to drive X movable section 72 and the Y linear motor used to drive Y movable section 74 can be the linear motor with small outputs, which makes it possible to reduce the running cost. Further, the infrastructure such as power-supply facility can be provided without difficulty. Further, the initial cost can also be reduced because the outputs of the linear motors can be small.

Further, in drive unit 70, Y movable section 74 that holds substrate holding frame 60 is supported by Y guide 73 in a noncontact manner, and substrate P is guided along the XY plane, and therefore, there is little risk that the vibration (disturbance) in the Z-axis direction transmitted via the air bearings from the side of surface plate 12 installed on floor surface F adversely affects control of substrate holding frame 60. Consequently, the attitude of substrate P becomes stable and the exposure accuracy is improved.

Further, Y movable section 74 of drive unit 70 is supported by Y guide 73 in a noncontact state and dust is prevented from being generated, and therefore, although Y guide 73 and Y movable section 74 are placed above the upper surfaces (gas jetting surfaces) of the plurality of air levitation units 50, the exposure processing of substrate P is not affected. Meanwhile, X guide 71 and X movable section 72 are placed below air levitation units 50, and therefore, even if dust is generated, the possibility that dust affects the exposure processing is low. However, X movable section 72 can be supported in a noncontact state with respect to X guide 71 so as to be movable in the X-axis direction, using, for example, air bearings or the like.

Further, weight canceller 42 of fixed-point stage 40 and air chuck unit 80 are mounted on Y beam 33 that is separated from surface plate 12 in terms of vibration, and therefore, for example, the reaction force of the drive force, vibration, or the like that is generated when substrate holding frame 60 (substrate P) is driven using drive unit 70 is not transmitted to weight canceller 42 and air chuck unit 80. Consequently, control of the position of air chuck unit 80 (i.e. the surface position of the portion subject to exposure of substrate P) using the Z-VCMs can be performed with high precision. Further, of the four Z-VCMs that drive air chuck unit 80, Z stators 47 are fixed to base frame 85 that is noncontact with Y beam 33, and therefore the reaction force of the drive force generated when air chuck unit 80 is driven is not transmitted to weight canceller 42. Consequently, the position of air chuck unit 80 can be controlled with high precision.

Further, positional information of substrate holding frame 60 is measured with the interferometer system that uses movable mirrors 62x and 62y that are fixed to substrate frame 60, or more specifically, are placed close to substrate P that is subject to final positioning control, and therefore, the stiffness between the control subject (substrate P) and the measurement points can be maintained high. More specifically, since the substrate whose final position should be known and the measurement points can be regarded as being integrated, the measurement accuracy is improved. Further, the positional information of substrate holding frame 60 is directly measured, and therefore, even if a linear motion error occurs in X movable section 72 and Y movable section 74, the measurement results are hard to be affected.

Further, the size in the X-axis direction of the upper surface (substrate holding surface) of main section 81 of air chuck unit 80 is set longer than the size in the X-axis direction of exposure area IA, and therefore, in a state where a portion subject to exposure (a portion to be exposed) of substrate P is located upstream of exposure area IA in the movement direction of substrate P, especially just before starting scanning exposure, the surface position of the portion subject to exposure of substrate P can be adjusted in advance, at an acceleration stage before performing constant-velocity movement of substrate P. Consequently, the surface position of the portion subject to exposure of substrate P can surely be located within a depth of focus of projection optical system PL from the beginning of exposure, and accordingly the exposure accuracy can be improved.

Further, in substrate stage device PST, a configuration is employed in which the plurality of air levitation units 50, fixed-point stage 40 and drive unit 70 are placed side by side in a planar manner on surface plate 12, and therefore, the assembly, adjustment, maintenance and the like can be performed without difficulty. Further, the members are small in number and also the respective members are lightweight, which facilitates the transportation as well.

Incidentally, for example, in the cases such as when the +X side end or the −X side end of substrate P passes above fixed-point stage 40, a state where substrate P overlaps only a part of air chuck unit 80 (a state where air chuck unit 80 is not completely covered with substrate P) is created. In such a case, since the load of substrate P acting on the upper surface of air chuck unit 80 is decreased, the force of air chuck unit 80 that levitates substrate P is weakened because of imbalance of the air, and distance Da (see FIG. 5B) between air chuck unit 80 and substrate P becomes smaller than a desired value (e.g. 0.02 mm). In this case, the main controller controls the air pressure and/or the air flow rate between air chuck unit 80 and the lower surface of substrate P (the pressure and/or the flow rate of the air that main section 81 jets and suctions) in accordance with the position of substrate P (in accordance with the overlapping area size of substrate P and the holding surface) such that distance Da between the upper surface of air chuck unit 80 and the lower surface of substrate P is maintained at a constant desired value at all times. It is preferable that to what level the pressure and/or the flow rate of the air should be set in accordance with the position of substrate P is obtained in advance by experiments. Further, it is also possible that the upper surface of air chuck unit 80 is divided into a plurality of areas along the X-axis direction and the flow rate and/or the pressure of air that is jetted and suctioned can be controlled for each of the divided areas. Further, the distance between the upper surface of air chuck unit 80 and the lower surface of substrate P can appropriately be adjusted by vertically moving air chuck unit 80 in accordance with the positional relation between substrate P and air chuck unit 80 (the overlapping area size of substrate P and the holding surface).

Second Embodiment

Next, a liquid crystal exposure apparatus of a second embodiment is described. Since the liquid crystal exposure apparatus of the present second embodiment has a configuration similar to the configuration of liquid crystal exposure apparatus 10 of the first embodiment described earlier except that a configuration of a substrate stage device that holds substrate P is different, only the configuration of the substrate stage device is explained in the description below. Herein, from the viewpoint of preventing the redundant description, members which have functions equivalent to those of the first embodiment are denoted by the same reference signs as the reference signs in the first embodiment and the description thereabout is omitted.

Figure 7A:
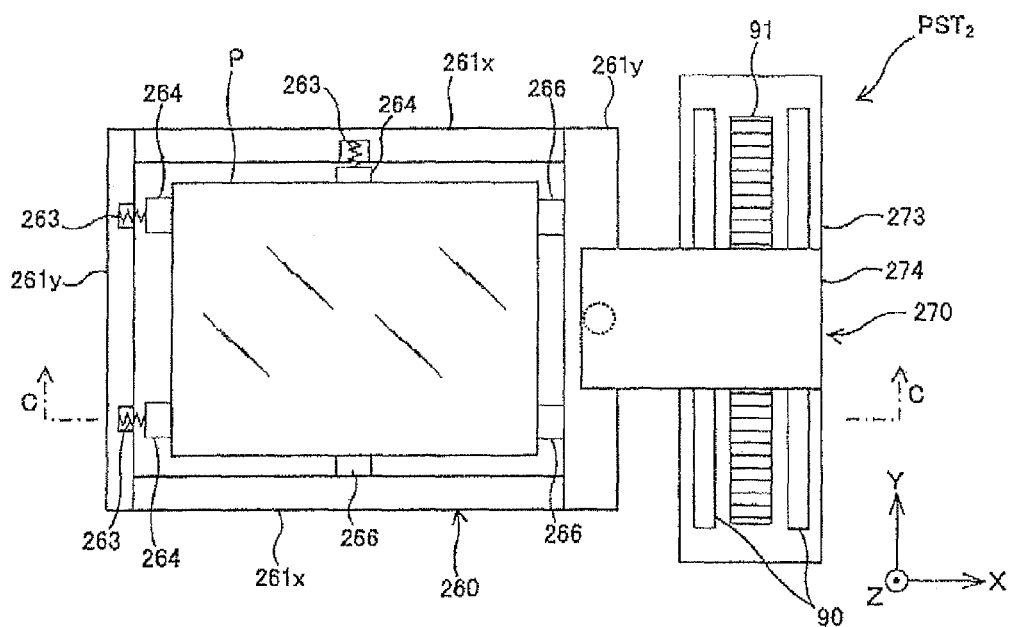
FIG. 7A is a plan view of a substrate stage device related to a second embodiment.

As shown in FIG. 7A, in a substrate stage device PST$_2$ related to the second embodiment, a configuration of a substrate holding frame 260 is different from the first embodiment. The different points are explained below. Similarly to the first embodiment, substrate holding frame 260 is formed into a rectangular frame shape that encloses substrate P, and has a pair of X frame members 261$x$ and a pair of Y frame members 261$y$. Incidentally, in FIG. 7A, the illustration of an X movable mirror and a Y movable mirror is omitted (see FIG. 2 for each of them).

Figure 7B:
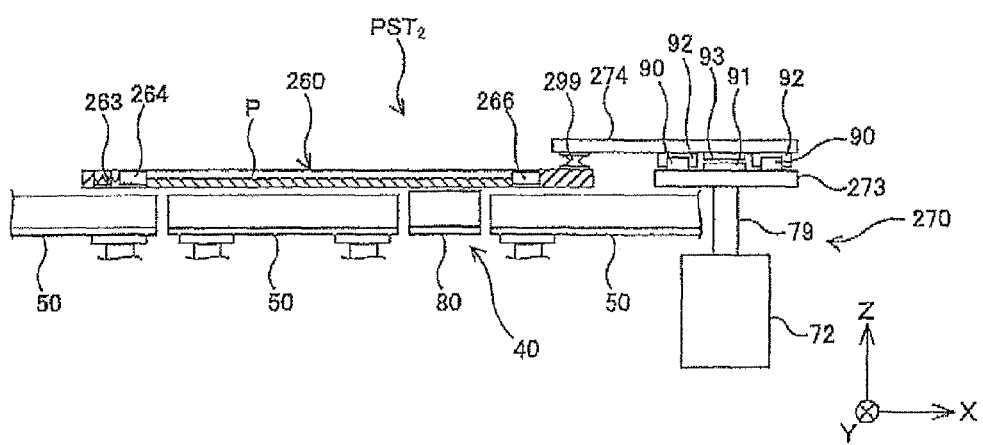
FIG. 7B is a cross-sectional view taken along the line C-C of FIG. 7A.

Substrate holding frame 60 (see FIG. 5A) of the first embodiment holds substrate P by adsorption from below with the hand having an L-like sectional shape, whereas in the case of substrate holding frame 260 of the second embodiment, a pair of pressing members 264 attached to Y frame member 261$y$ on the −X side via compression coil springs 263 and one pressing member 264 attached to X frame member 261$x$ on the +Y side via a compression coil spring 263 press substrate P against a pair of reference members 266 fixed to Y frame member 261$y$ on the +X side and one reference member 266 fixed to X frame member 261$x$ on the −Y side, respectively, (make the pressing forces parallel to the XY plane act on substrate P), and thereby substrate holding frame 260 holds substrate P. Consequently, different from the first embodiment, substrate P is housed within an opening of substrate holding frame 260 that is a frame-shaped member (see FIG. 7B). As shown in FIG. 7B, substrate P is placed such that its lower surface is placed so as to be substantially coplanar with the lower surface of substrate holding frame 260. Incidentally, the number of the pressing members and the reference members can appropriately be changed in accordance with, for example, the size of the substrate or the like. Further, the pressing member that presses the substrate is not limited to the compression coil spring but can be an air cylinder or a slide unit that uses a motor.

Further, in substrate stage device PST$_2$ related to the second embodiment, as shown in FIG. 7B, a pair of Y linear guides 90, placed at a predetermined distance in the X-axis direction, are fixed to the upper surface of a Y guide 273 that is a tabular member fixed to X movable section 72 via shaft 79. Further, between the pair of Y linear guides 90, a magnetic unit 91 including a plurality of magnets disposed along the Y-axis direction is fixed. Meanwhile, Y movable section 274 is made up of a tabular member parallel to the XY plane, and on the lower surface of Y movable section 274, a plurality, e.g. four, of sliders 92 each of which is formed so as to have an inverse U-like sectional shape are fixed (see FIG. 7B, of the four sliders 92, the illustration of the two on the +Y side is omitted). The four sliders 92 each have a rolling element (e.g. a ball, a skid or the like) which is not illustrated, and two each of sliders 92 are engaged with Y linear guide 90 on the +X side and Y linear guide 90 on the −X side in a slidable state with respect to the corresponding Y linear guide 90, respectively. Further, on the lower surface of Y movable section 274, a coil unit 93 (see FIG. 7B) including coils is fixed so as to be opposed to magnetic unit 91 fixed to Y guide 273. Coil unit 93 and magnetic unit 91 configure a Y linear motor by the electromagnetic force drive method that drives Y movable section 274 in the Y-axis direction on Y guide 273 owing to the electromagnetic interaction. Incidentally, the placement of the coil unit and the magnetic unit that configure the Y linear motor can be reverse to the above-described placement.

Further, in the second embodiment, Y movable section 274 and substrate holding frame 260 are connected by a hinge device 299. While hinge device 299 restricts relative movement of Y movable section 274 and substrate holding frame 260 along a horizontal plane (XY plane), hinge device 299 allows relative movement in directions around predetermined axis lines parallel to the XY plane including the θx direction and the θy direction. Consequently, Y movable section 274 and substrate holding frame 260 integrally move along the XY plane, but in the case where substrate P is tilted with respect to XY plane by fixed-point stage 40, only substrate holding frame 260 is tilted with respect to the XY plane following the tilt of substrate P, and therefore the load is not placed on Y linear guide 90 and slider 92.

Since substrate holding frame 260 of substrate stage device $PST_2$ related to the second embodiment as described above has no protrusions, including substrate P, which protrude below the lower surfaces of X frame members 261x and Y frame members 261y, it is possible to make the lower surface of substrate holding frame 260 and the upper surfaces (gas jetting surfaces) of the plurality of air levitation units 50 come close together compared with the first embodiment. Accordingly, the height of levitation of substrate P by air levitation units 50 can be lowered, which allows the flow rate of the air jetted from air levitation units 50 to be reduced. Consequently, the running cost can be decreased. Further, since substrate holding frame 260 has no protrusions on its lower surface, the pair of X frame members 261x and the pair of Y frame members 261y can pass above air chuck unit 80 respectively. Consequently, the movement course of substrate P used when substrate P is guided to, for example, a substrate exchange position that is not illustrated, an alignment measurement position or the like can be freely set.

Third Embodiment

Next, a third embodiment is described. Since a liquid crystal exposure apparatus of the third embodiment has a configuration similar to the configuration of each of the liquid crystal exposure apparatuses of the first and second embodiments described earlier except that a configuration of a substrate stage device that holds substrate P is different, only the configuration of the substrate stage device is described below. Incidentally, members which have functions similar to those in the first and second embodiments described above are denoted by the same reference signs as the reference signs in the first and second embodiments described above and the description thereabout is omitted.

Figure 8:
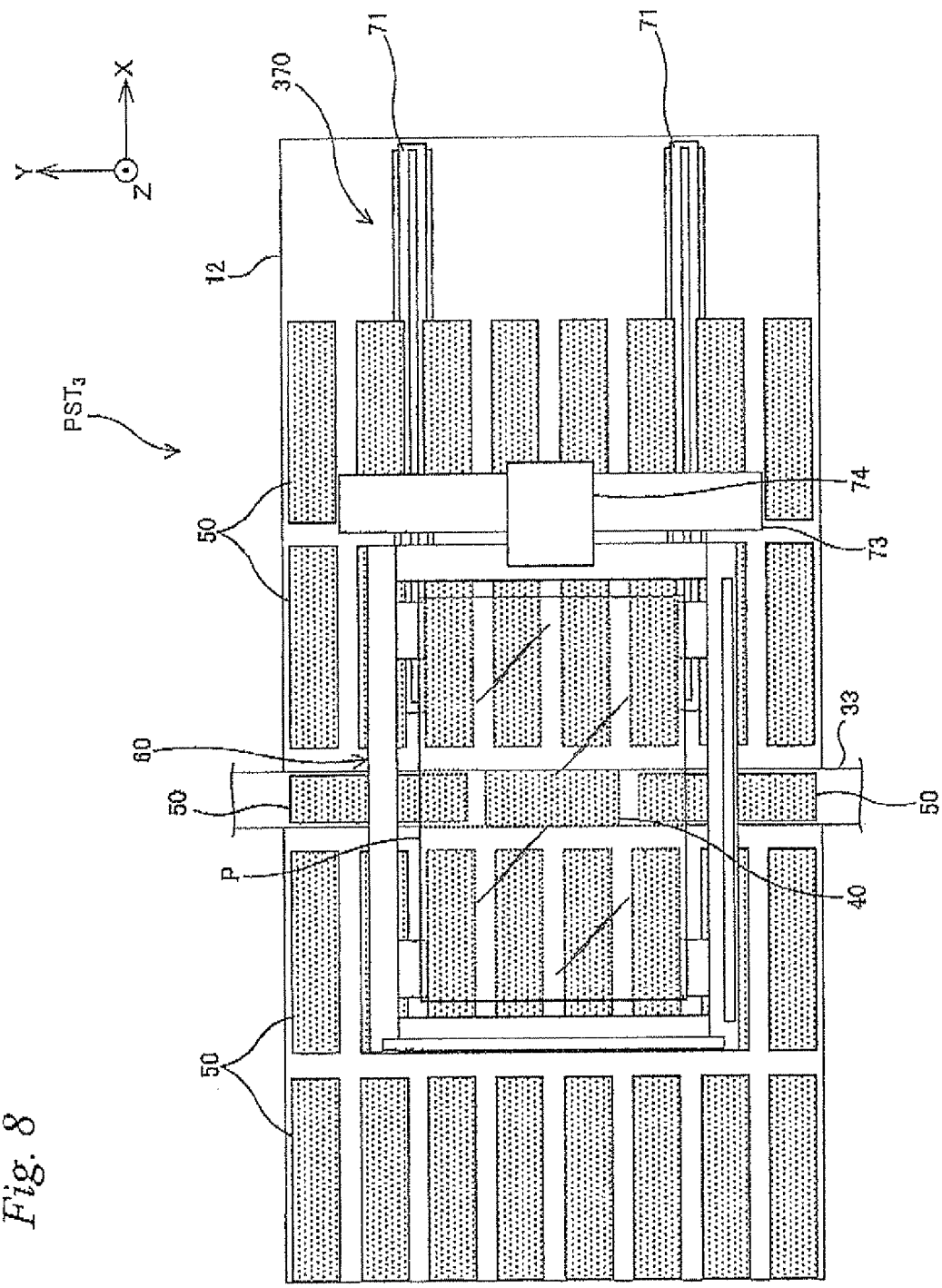
FIG. 8 is a plan view of a substrate stage device related to a third embodiment.

As shown in FIG. 8, in a substrate stage device $PST_3$ related to the present third embodiment, a drive unit 370 has a pair of X guides 71, which is different from the first embodiment described above. The pair of X guides 71 are placed parallel to each other at a predetermined distance in the Y-axis direction. One (on the −Y side) of the pair of X guides 71 is placed between the second air levitation units 50 and the third air levitation units 50 that configure the third and fourth air levitation unit rows, and the other (on the +Y side) is placed between the sixth air levitation units 50 and the seventh air levitation units 50. On each of the pair of X guides 71, X movable section 72 (X movable section 72 is not illustrated in FIG. 8, see FIGS. 1 and 3) is mounted. A pair of X movable sections 72 are synchronously driven on the respective corresponding X guides 71 by the main controller that is not illustrated. Further, Y guide 73 is installed over the pair of X movable sections 72 by being supported on the pair of X movable sections 72 via shaft 79 (shaft 79 is not illustrated in FIG. 8, see FIGS. 1 and 3), similarly to the first embodiment.

In substrate stage device $PST_3$ related to the third embodiment, Y guide 73 is supported, at two points that are apart in the Y-axis direction, by X movable sections 72, and therefore, for example, in the case where Y movable section 74 is located near the +Y side end or the −Y side end on Y guide 73, the downward bending of one of the ends of Y guide 73 is restrained and so on, which allows the attitude of Y guide 73 to be stable. Thus, this is especially effective in the cases such as when the length of Y guide 73 is increased in order to guide substrate P with a long stroke in the Y-axis direction.

Incidentally, in substrate stage device $PST_3$ of the third embodiment, one of X guides 71 is placed on the −Y side of fixed-point stage 40 and the other of X guides 71 is placed on the +Y side of fixed-point stage 40, and therefore, each of the pair of X guides 71 can be arranged extending to the vicinity of the −X side end of surface plate 12 (in this case, the pair of X guides 71 are configured so as not to come in contact with Y beam 33 and each of air levitation units 50 on the +Y side and the −Y side of fixed-point stage 40). In such a case, it becomes possible to guide substrate holding frame 60 to the −X side beyond fixed-point stage 40 (e.g. it is also possible to guide substrate holding frame 60 to the −X side beyond the −X side end of surface plate 12). Since the movable range where substrate P is movable within the XY plane can be increased in this manner, it is possible to move substrate P to a position (e.g. the substrate exchange position, the alignment measurement position, or the like) different from the exposure position using drive unit 370. Incidentally, while the pair (two) of X guides 71 are arranged in the present third embodiment, the number of the X guides is not limited thereto, but can be three or more.

Fourth Embodiment

Next, a fourth embodiment is described with reference to FIGS. 9 and 10. Since a liquid crystal exposure apparatus of the fourth embodiment has a configuration similar to the configuration of each of the liquid crystal exposure apparatuses of the first, second and third embodiments except that a configuration of a substrate stage device is different, only the configuration of the substrate stage device is described below. Incidentally, members which have functions similar to those in the first to third embodiments described above are denoted by the same reference signs as the reference signs in the first to third embodiments described above and the description thereabout is omitted.

Figure 9:
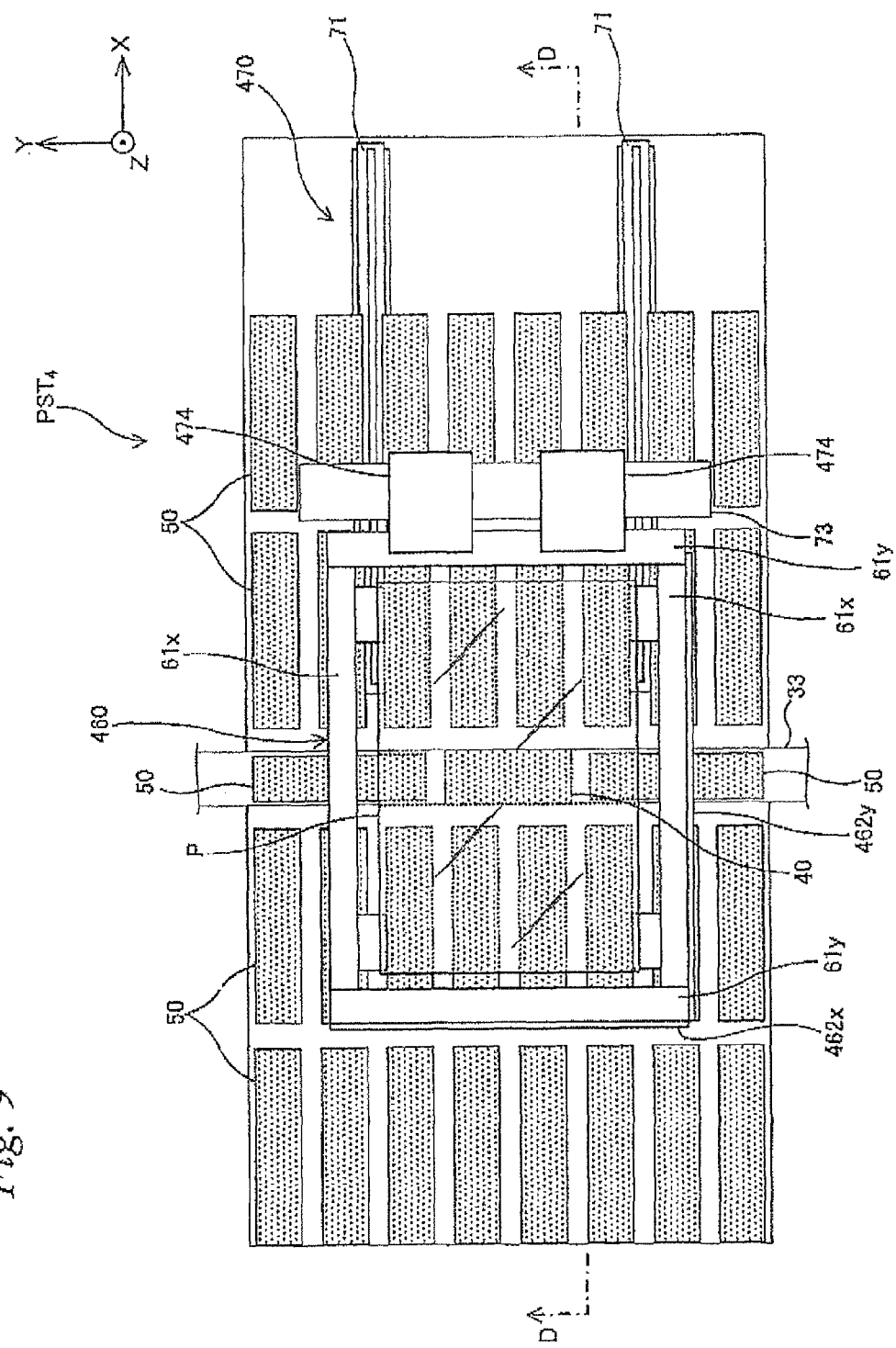
FIG. 9 is a plan view of a substrate stage device related to a fourth embodiment.
Figure 10:
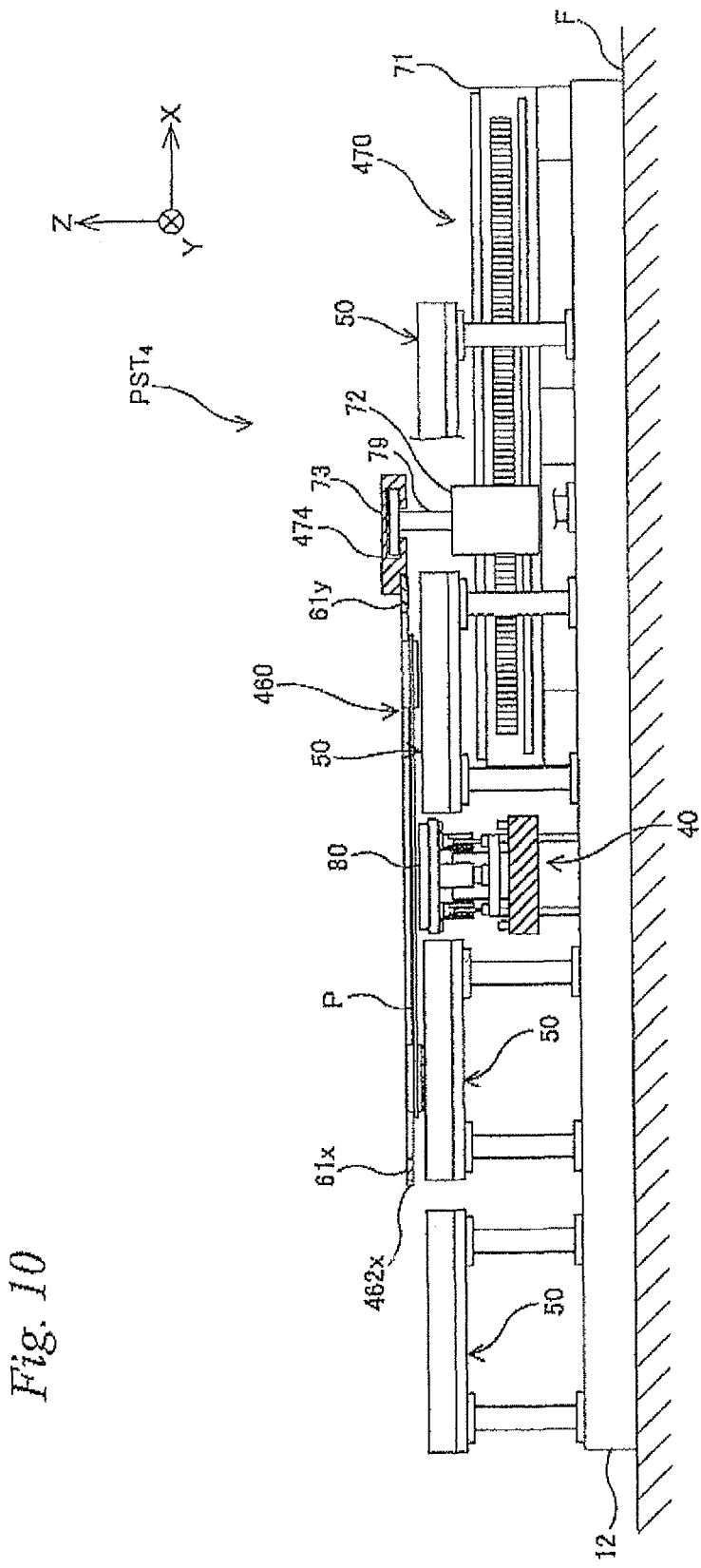
FIG. 10 is a cross-sectional view taken along the line D-D of FIG. 9.

As shown in FIG. 9, a substrate holding frame 460 of a substrate stage device $PST_4$ related to the present fourth embodiment is formed into a frame shape made up of a pair of X frame members 61x with the X-axis direction serving as their longitudinal directions and a pair of Y frame members 61y with the Y-axis direction serving as their longitudinal directions. And, an X movable mirror 462x is fixed to the side surface on the, −X side (outer side surface) of Y frame member 61y on the −X side and a Y movable mirror 462y is fixed to the side surface on the −Y side (outer side surface) of X frame member 61x on the −Y side. X movable mirror 462x and Y movable mirror 462y are used when the interferometer system measures positional information of substrate holding frame 460 within the XY plane. Incidentally, in the case where each of the pair of X frame members 61x and the pair of Y frame members 61y is formed with, for example, ceramics, the side surface on the −X side (outer side surface) of Y frame member 61y on the −X side and the side surface on the −Y side (outer side surface) of X frame member 61x on the −Y side can respectively be mirror-polished to serve as reflection surfaces.

In a drive unit 470, Y guide 73 is installed over a pair of X movable sections 72, which is similar to substrate stage device $PST_3$ (see FIG. 8) of the third embodiment described above. And, as shown in FIG. 9, above Y guide 73, a pair of Y movable sections 474 are each supported in a noncontact state so as to be movable in the Y-axis direction with a Y linear motor (the illustration is omitted). The pair of Y movable sections 474 are placed at a predetermined distance in the Y-axis direction, and are driven in synchronization by the Y linear motors. Incidentally, although Y movable section 474 on the +Y side is hidden behind Y movable section 474 on the −Y side in a direction of the depth of the page surface in FIG. 10, the pair of Y movable sections 474 have substantially the same configuration (see FIG. 9). In substrate holding frame 460, Y frame member 61y on the +X side is fastened with the pair of Y movable sections 474.

In substrate stage device $PST_4$ related to the fourth embodiment as described above, substrate holding frame 460 is supported, at two points that are apart in the Y-axis direction, by the pair of Y movable sections 474, and therefore, the bending (especially, bending of the ends on the +Y side and on the −Y side) owing to the self weight can be restrained. Further, with this configuration, the stiffness of substrate holding frame 460 in a direction parallel to a horizontal plane is improved, and therefore, the stiffness of substrate P, which is held by substrate holding frame 460, in a direction parallel to a horizontal plane is also improved, which improves the positioning accuracy of substrate P.

Further, on the side surfaces of X frame member 61x and Y frame member 61y that configure substrate holding frame 460, movable mirrors 462x and 462y are respectively arranged, or more specifically, substrate holding frame 460 itself has the reflection surfaces, and therefore, the weight and the size of substrate holding frame 460 can be reduced, which improves the position controllability of substrate holding frame 460. Further, the positions in the Z-axis direction of the reflection surfaces of movable mirrors 462x and 462y come close to the position of the surface of substrate P in the Z-axis direction, and therefore, occurrence of the so-called Abbe error can be restrained, which improves the positioning accuracy of substrate P.

Fifth Embodiment

Next, a fifth embodiment is described with reference to FIGS. 11 and 12. Since a liquid crystal exposure apparatus of the fifth embodiment has a configuration similar to the configuration of each of the liquid crystal exposure apparatuses of the first to fourth embodiments except that a configuration of a substrate stage device is different, only the configuration of the substrate stage device is described below. Incidentally, members which have functions similar to those in the first to fourth embodiments described above are denoted by the same reference signs as the reference signs in the first to fourth embodiments described above and the description thereabout is omitted.

Figure 11:
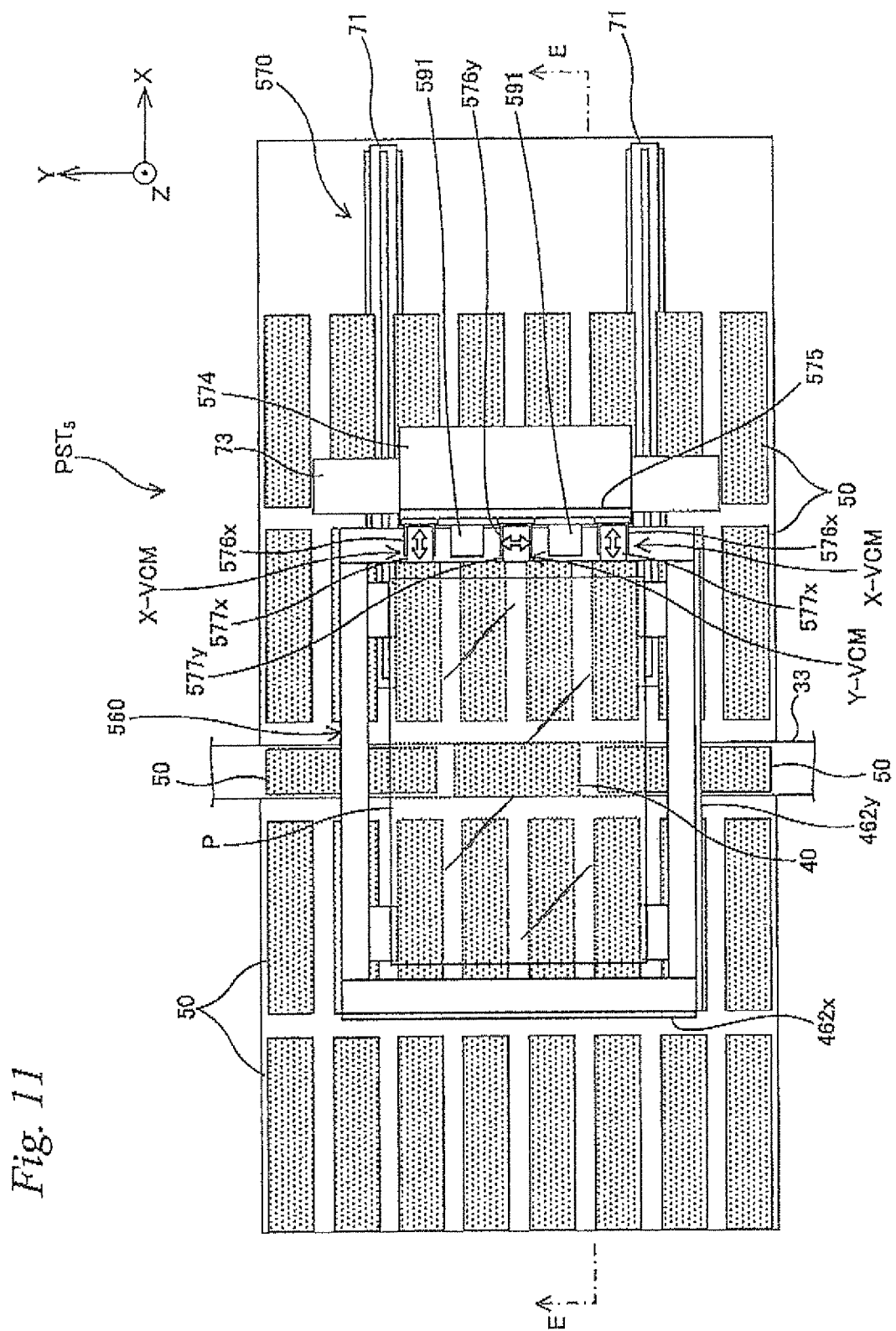
FIG. 11 is a plan view of a substrate stage device related to a fifth embodiment.
Figure 12:
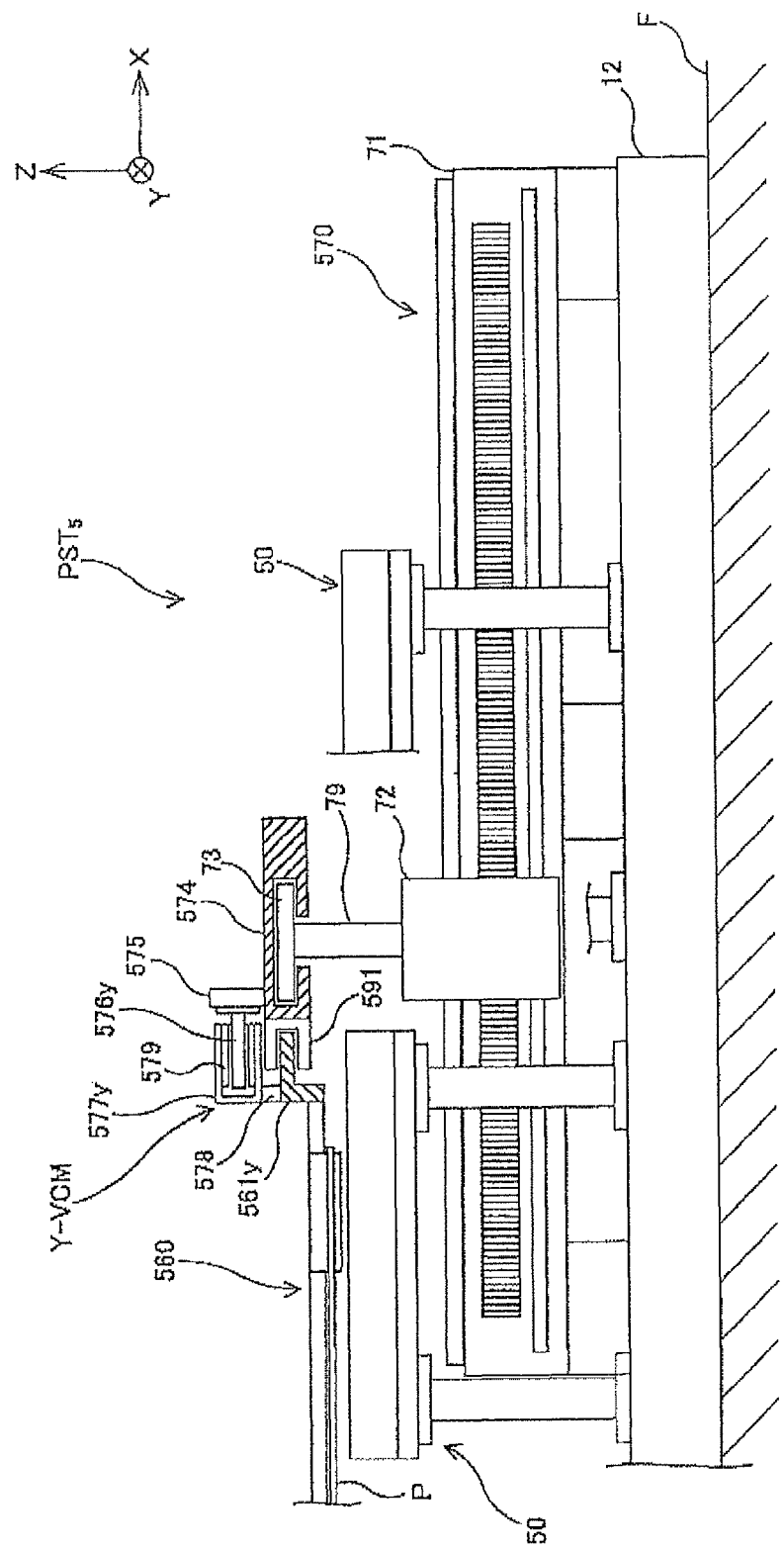
FIG. 12 is a cross-sectional view taken along the line E-E of FIG. 11.

As shown in FIG. 11, in a substrate stage device $PST_5$ related to the fifth embodiment, one Y movable section 574 is supported by Y guide 73 in a noncontact state so as to be movable in the Y-axis direction by a Y linear motor (the illustration is omitted). Further, as shown in FIG. 12, Y movable section 574 has, on the side surface on the −X side, a pair of holding members 591 each of which is made up of a member formed so as to have a U-like XZ sectional shape. The pair of holding members 591 are placed at a predetermined distance along the Y-axis direction. Each of the pair of holding members 591 has noncontact thrust bearings, e.g. air bearings or the like, on a pair of opposed surfaces that are opposed to each other. Further, substrate holding frame 560 has a Y frame member 561y on the +X side that is formed so as to have an L-like XZ sectional shape and the +X side end of Y frame member 561y is inserted between the pair of opposed surfaces of each of the pair of holding members 591, and thereby substrate holding frame 560 is held by Y movable section 574 in a noncontact manner. Incidentally, as the noncontact thrust bearings arranged on the pair of holding members 591, for example, magnetic bearings or the like, can be used.

As shown in FIG. 11, on the upper surface of Y movable section 574, one Y stator 576y and a pair of X stators 576x are fixed via a fixing member 575. Y stator 576y is located between the pair of holding members 591 in a planar view. The pair of X stators 576x are apart in the Y-axis direction and are located on the +Y side of holding member 591 on the +Y side and on the −Y side of holding member 591 on the −Y side, respectively, in a planar view. Y stator 576y and the pair of X stators 576x each have a coil unit including coils (the illustration is omitted). The magnitude and the direction of the electric current supplied to the coils of the coil units are controlled by the main controller that is not illustrated.

Further, on the upper surface of Y frame member 561y on the +X side of substrate holding frame 560, one Y mover 577y and a pair of X movers 577x are each fixed via a fixing member 578 (see FIG. 12, the illustration of the fixing members that support the pair of Y movers 577x respectively is omitted), so as to correspond to Y stator 576y and the pair of X stators 576x described above. Each of the one Y mover 577y and the pair of X movers 577x is formed so as to have a U-like XZ sectional shape and has a pair of opposed surfaces that are opposed to each other between which the corresponding Y stator 576y or X stator 576x is inserted (see FIG. 12). The one Y mover 577y and the pair of X movers 577x each have a magnetic unit 579 including magnets on a pair of opposed surfaces that are opposed to each other (see FIG. 12, the illustration of the magnetic units of the pair of X movers 577x is omitted). Magnetic unit 579, which Y mover 577y has, configures a Y voice coil motor (Y-VCM) by the electromagnetic force drive method that finely drives substrate holding frame 560 in the Y-axis direction (see an arrow in FIG. 11) owing to the electromagnetic interaction with the coil unit that Y stator 576y has. Further, the magnetic units, which the pair of K movers 577x have, configure a pair of X voice coil motors (X-VCMs) by the electromagnetic force drive method that finely drive substrate holding frame 560 in the X-axis direction (see arrows in FIG. 11) owing to the electromagnetic interaction with the respectively corresponding coil units that X stators 576x have. Substrate holding frame 560 and Y movable section 574 are electromagnetically coupled in a noncontact state by the electromagnetic forces generated by the Y-VCM and the pair of X-VCMs, and integrally move along the XY plane. Incidentally, on the side surfaces of substrate holding frame 560, X movable mirror 462x and Y movable mirror 462y are fixed respectively, which is similar to the fourth embodiment described above.

In substrate stage device $PST_5$ related to the fifth embodiment, for example, during an exposure operation or the like, the main controller controls the positions of X movable section 72 and Y movable section 574 using the X linear motor and the Y linear motor based on the measurement values of a linear encoder system that is not illustrated, thereby performing the rough positioning of substrate holding frame 570 (substrate P) within the XY plane, and also finely drives substrate holding frame 570 along the XY plane by appropriately controlling the Y-VCM and the pair of X-VCMs based on the measurement values of the interferometer system, thereby performing the final positioning of substrate P within the XY plane. On this operation, the main controller drives substrate holding frame 560 also in the θz direction by appropriately controlling the outputs of the pair of X-VCMs. More specifically, in substrate stage device $PST_5$, an XY two-dimensional stage device composed of the pair of X guides 71, X movable section 72, Y guide 73 and Y movable section 574 functions as a so-called coarse movement stage device, and substrate holding frame 560 that is finely driven by the Y-VCM and the pair of X-VCMs with respect to Y movable section 574 functions as a so-called fine movement stage device.

As described above, according to substrate stage device PST$_5$ related to the fifth embodiment, since the positioning of substrate P within the XY plane can be performed with high precision with respect to Y movable section 574 using substrate holding frame 570 that is lightweight, the positioning accuracy and the positioning speed of substrate P are improved. On the other hand, since the nano-order accuracy is not required for the positioning accuracy of X movable section 72 by the X linear motor and the positioning accuracy of Y movable section 574 by the Y linear motor, an inexpensive linear motor and an inexpensive linear encoder system can be used. Further, since substrate holding frame 560 and Y movable section 574 are separated in terms of vibration, the vibration in a horizontal direction and the reaction forces of the drive forces of the X-VCMs and the Y-VCM do not travel to substrate holding frame 560, Sixth Embodiment Next, a sixth embodiment is described with reference to FIG. 13. Since a liquid crystal exposure apparatus of the sixth embodiment has a configuration similar to the configuration of each of the liquid crystal exposure apparatuses of the first to fifth embodiments except that a configuration of a substrate stage device is different, only the configuration of the substrate stage device is described below. Incidentally, members which have functions similar to those in the first to fifth embodiments described above are denoted by the same reference signs as the reference signs in the first to fifth embodiments described above and the description thereabout is omitted.

Figure 13:
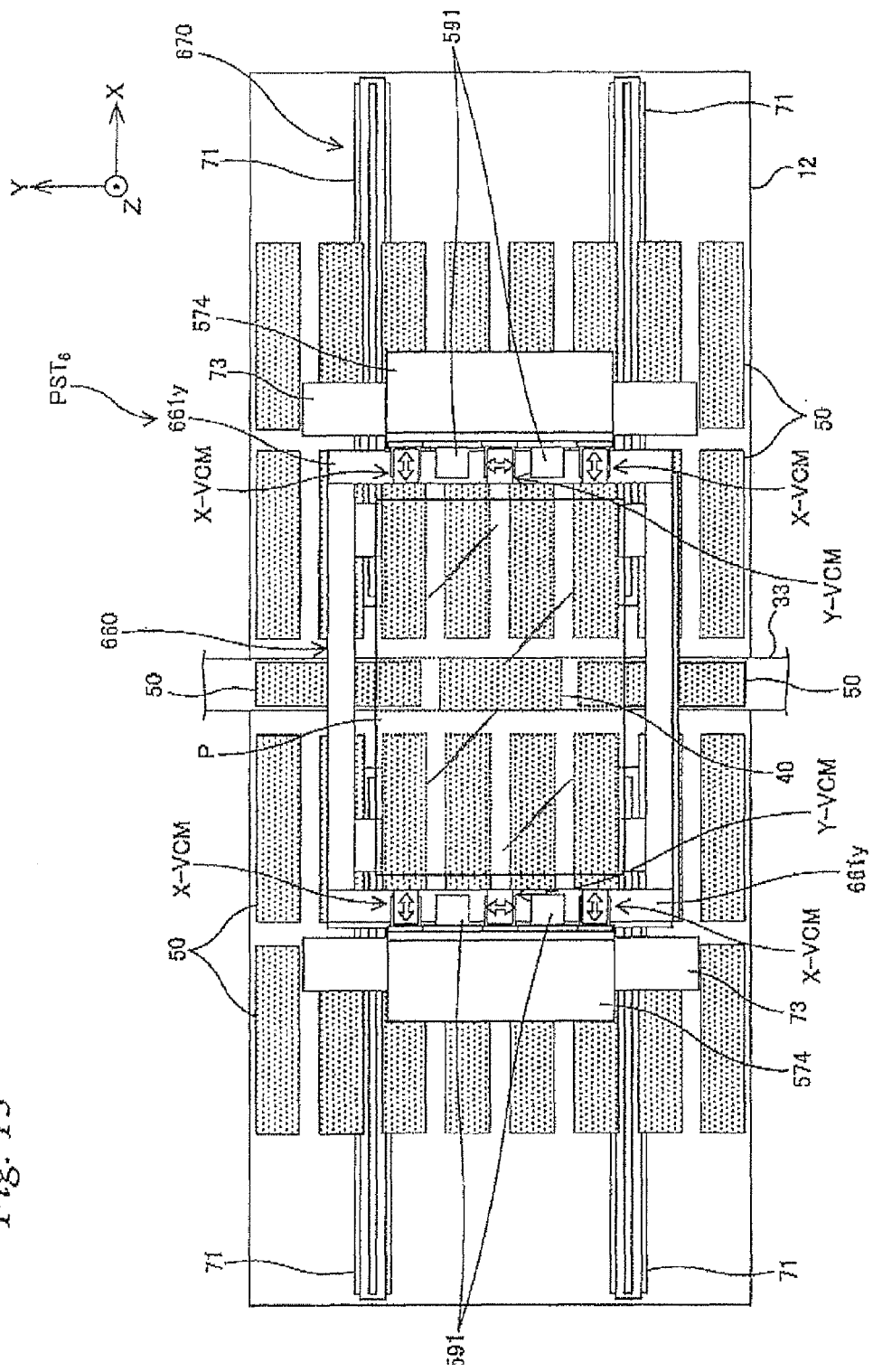
FIG. 13 is a plan view of a substrate stage device related to a sixth embodiment.

As shown in. FIG. 13, a drive unit 670 of a substrate stage device PST$_6$ related to the six embodiment has an XY two-dimensional stage device having a configuration similar to that of the fifth embodiment described above, in an area on the +X side of fixed-point stage 40. More specifically, the XY two-dimensional stage, which is composed of a pair of X guides 71 fixed on surface plate 12, a pair of X movable sections 72 (not illustrated in FIG. 13, see FIG. 12) that move in the X-axis direction on the pair of X guides 71, a Y guide 73 installed over the pair of X movable sections 72, and a Y drive section 574 (which is referred to as a first Y movable section 574, for the sake of convenience) that moves in the Y-axis direction on Y guide 73, is arranged in the area on the +X side of fixed-point stage 40. The first Y movable section 574 has a pair of holding members 591 that hold, in a noncontact manner, a substrate holding frame 660 that has a configuration similar to that of the fifth embodiment described above. Further, substrate holding frame 660 is finely driven in the X-axis direction, the Y-axis direction and the θz direction with respect to the first Y movable section 574, by three voice coil motors (one Y-VCM and a pair of X-VCMs) that are configured of a Y stator and a pair of X stators fixed to Y movable section 574 that has a configuration similar to the fifth embodiment described above and a Y mover and a pair of X movers fixed to a Y frame member 661y on the +X side of substrate holding frame 660.

Substrate stage device PST$_6$ further has another XY two-dimensional stage device, in an area on the −X side of fixed-point stage 40, which has a configuration similar to the XY two-dimensional stage device described earlier (however, symmetric with respect to Y-axis (bilateral symmetric on the page surface)), or more specifically, which is composed of a pair of X guides 71, a pair of X movable sections 72 (not illustrated in FIG. 13, see FIG. 12), Y guide 73 and Y movable section 574 (which is referred to as a second Y movable section 574 for the sake of convenience). Substrate holding frame 660 has Y frame member 661y on the −X side that is also formed so as to have an L-like sectional shape (see FIG. 12), which is similar to Y frame member 661y on the +X side, and Y frame member 661y on the −X side is held, in a non-contact manner, by a pair of holding members 591 that the second Y movable section 574 has.

Further, substrate holding frame 660 is finely driven in the X-axis direction, the Y-axis direction and the θz direction with respect to the second Y movable section 574, by three voice coil motors (one Y-VCM and a pair of X-VCMs) that are configured of a Y stator and a pair of X stators fixed to the second Y movable section 574, and a Y mover and a pair of X movers fixed to Y frame member 661y on the −X side of substrate holding frame 660. The main controller, which is not illustrated, coarsely adjusts the position of substrate holding frame 660 within the XY plane by synchronously controlling the X linear motors and the Y linear motor on each of the +X side and the −X side of fixed-point stage 40 based on the measurement values of a linear encoder system that is not illustrated, and also finely adjusts the position of substrate holding frame 660 (substrate P) within the XY plane by appropriately controlling the Y-VCM and the pair of the X-VCMs on each of the +X side and the −X side of substrate holding frame 660 (substrate P) based on the measurement values of an interferometer system to finely drive the substrate holding frame in each of the X-axis, Y-axis and θz directions.

In substrate stage device PST$_6$ related to the sixth embodiment, since both ends of substrate holding frame 660 in the X-axis direction are supported by the XY two-dimensional stage devices, the bending (downward bending on the free end side) owing to the self weight of substrate holding frame 660 is restrained. Further, since the drive forces by the voice coil motors are made to act on substrate holding frame 660 from the +X side and the −X side, respectively, it is possible to make the drive forces of the respective voice coil motors act on the vicinity of the position of the center of gravity of a system that is composed of substrate holding frame 660 and substrate P. Consequently, the moment in the θz direction can be restrained from acting on substrate holding frame 660. Incidentally, it is also possible that, only one each of the X-VCM is placed on the −X side and the +X side of substrate holding frame 660, at diagonal positions (such that the center of the diagonal line is located in the vicinity of the center of gravity of substrate P) such that the X-VCMs drive the position of the center of gravity of substrate holding frame 660.

Seventh Embodiment

Next, a seventh embodiment is described with reference to FIGS. 14 and 15. Since a liquid crystal exposure apparatus of the seventh embodiment has a configuration similar to the configuration of each of the liquid crystal exposure apparatuses of the first to sixth embodiments except that a configuration of a substrate stage device is different, only the configuration of the substrate stage device is described below. Incidentally, members which have functions similar to those in the first to sixth embodiments described above are denoted by the same reference signs as the reference signs in the first to sixth embodiments described above and the description thereabout is omitted.

Figure 14:
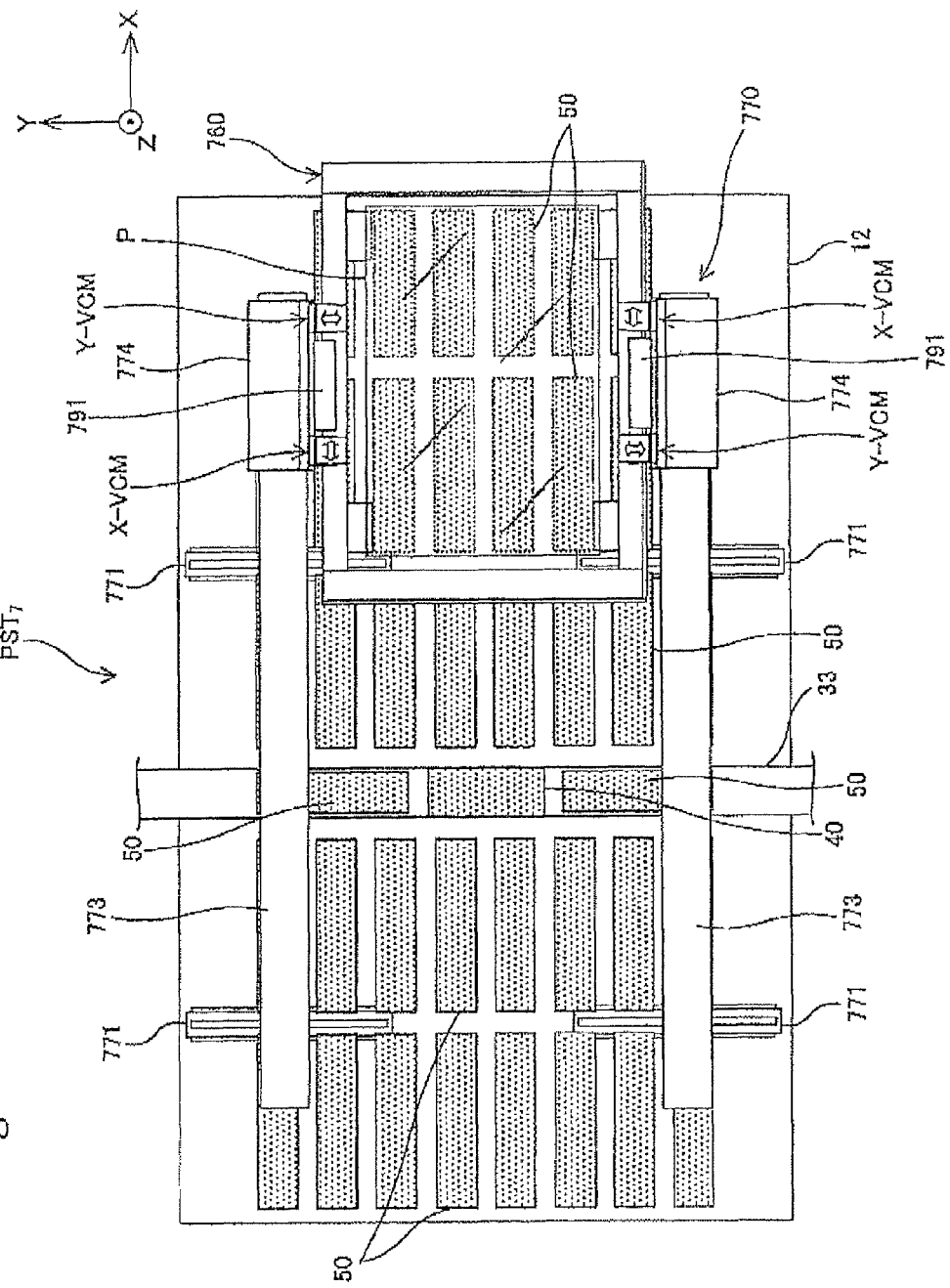
FIG. 14 is a plan view of a substrate stage device related to a seventh embodiment.

As shown in FIG. 14, a substrate stage device PST$_7$ is different from the substrate stage device related to each of the first to sixth embodiments described above, in a configuration of a drive unit 770 that drives a substrate holding frame 760 along the XY two-dimensional plane. In substrate stage device PST$_7$, a pair of Y guides 771 with the Y-axis direction serving as their longitudinal directions are placed at a predetermined distance in the Y-axis direction, between the first air levitation unit row and the second air levitation unit row, and between the third air levitation unit row and the fourth air levitation unit row. These four Y guides 771 have functions similar to those of X guides 71 (see FIG. 3) that the substrate stage device related to each of the first to sixth embodiments described above has. Further, as shown in FIG. 15, on each of the four Y guides 771, a Y movable section 772 is mounted (the illustration of the two Y movable sections 772 on the −X side is omitted) that has functions similar to those of X movable section 72 (see FIG. 3) that the substrate stage device related to each of the first to sixth embodiments described above has. The four Y movable sections 772 are synchronously driven in the Y-axis direction by a Y linear motor by the electromagnetic force drive method that is composed of Y stators 776 (see FIG. 15) that Y guides 771 respectively have and Y movers (the illustration is omitted) that Y movable sections 772 respectively have.

Figure 15:
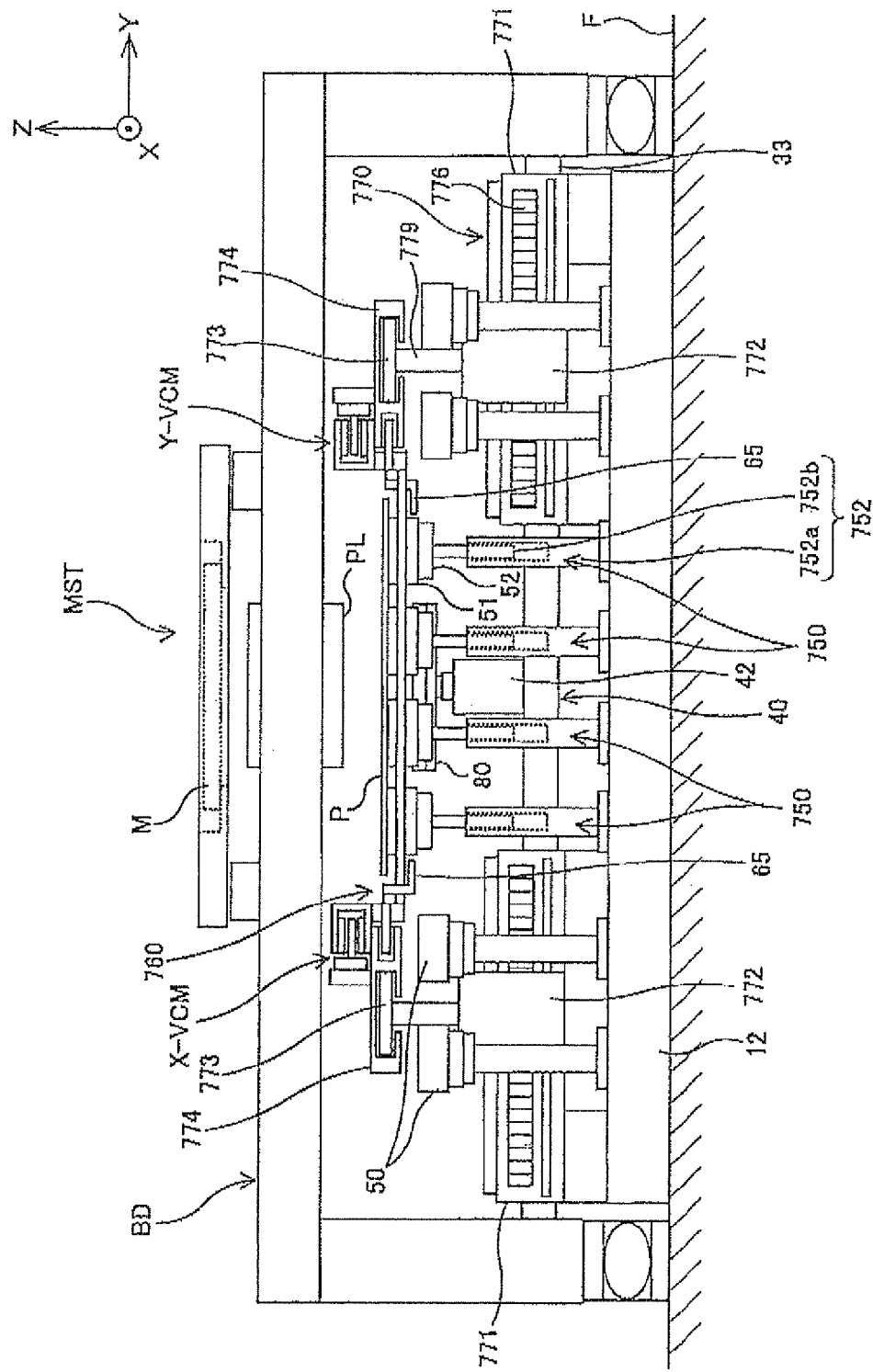
FIG. 15 is a side view of the substrate stage device of FIG. 14 when viewed from the +X side.

Between the two Y movable sections 772 on the +Y side, as shown in FIG. 14, an X guide 773 made up of a tabular member with the X-axis direction serving as its longitudinal direction is installed via a shaft 779 (see FIG. 15). And, between the two Y movable sections 772 on the −Y side as well, a similar X guide 773 is installed. On each of a pair of X guides 773, an X movable section 774 is mounted that is a member, for example, corresponding to Y movable section 74 (see FIG. 2) that the substrate stage device of the first embodiment described above has. A pair of X movable sections 774 are synchronously driven in the X-axis direction by an X linear motor by the electromagnetic force drive method that is composed of X stators (the illustration is omitted) that X guides 773 respectively have and X movers (the illustration is omitted) that X movable sections 774 respectively have. The pair of X movable sections 774 each has a holding member 791 that holds substrate holding frame 760 in a noncontact manner using noncontact thrust bearings (the illustration is omitted) such as air bearings or the like, which is similar to holding member 591 that Y movable section 574 of the substrate stage device (see FIG. 13) related to the sixth embodiment described above has. With the configuration as described above, substrate stage device PST$_7$ related to the seventh embodiment can move substrate holding frame 760 in the X-axis direction with a long stroke, compared with each of the substrate stage devices related to the first to sixth embodiments described above.

Further, substrate holding frame 760 is finely driven in each of the X-axis, Y-axis and θz directions as needed, by the X-VCM and the Y-VCM placed on the +Y side of substrate holding frame 760 and the X-VCM and the Y-VCM placed on the −Y side of substrate holding frame 760. The configurations of the X-VCM and the Y-VCM are the same as those of the X-VCM and the Y-VCM in the sixth embodiment described above. In this case, on the +Y side of substrate holding frame 760, the X-VCM is located on the −X side of the Y-VCM, and on the −Y side of substrate holding frame 760, the X-VCM is located on the +X side of the Y-VCM. Further, the two X-VCMs are located at diagonal positions and the two Y-VCMs are located at diagonal positions with respect to substrate holding frame 760 (such that the centers of the diagonal lines are located in the vicinity of the center of gravity of substrate P). Consequently, similar to the sixth embodiment described above, substrate P can be driven at the center of gravity (can be driven by making a drive force act on the vicinity of the position of the center of gravity). Consequently, when substrate holding frame 760 is finely driven in the X-axis direction, the X-axis direction and the θz direction using a pair of the X-VCMs and/or a pair of the Y-VCMs, substrate P can be rotated around the vicinity of the position of the center of gravity of a system, as the center, that is composed of substrate holding frame 760 and substrate P.

Moreover, although each of the X-VCMs and the Y-VCMs has a configuration protruding on the +Z side above the upper surface of substrate holding frame 760 (see FIG. 15), it is possible to make substrate holding frame 760 pass below projection optical system PL to move in the X-axis direction, without substrate holding frame 760 interfering with projection optical system PL, because the X-VCMs and the Y-VCMs are located on the +Y side and −Y side of projection optical system PL (see FIG. 15).

Further, substrate stage device PST$_7$ has a fifth air levitation unit row that is composed of six air levitation units 50 disposed at a predetermined distance in the Y-axis direction, in an area on the +X side of fixed-point stage 40, which is located on the +X side of the fourth air levitation unit row. And, the third to sixth air levitation units 50 of the fourth air levitation unit row and the second to fourth air levitation units 50 of the fifth air levitation unit row each have main section 51 (see FIG. 15) that is movable in the Z-axis direction (vertically movable), as shown in FIG. 15. In the description below, air levitation units 50 each having main section 51 that is vertically movable as described above are referred to air levitation units 750 for the sake of convenience, in order to distinguish them from the other air levitation units 50 each having main section 51 that is fixed. A leg section 752 of each of a plurality (e.g. eight in this embodiment) of air levitation units 750 is, as shown in FIG. 15, includes a cylinder-like case 752a fixed on surface plate 12 and a shaft 752b one end of which is housed inside case 752a and the other end of which is fixed to support section 52, and which is driven in the Z-axis direction with respect to case 752a, by for example, a uniaxial actuator that is not illustrated such as an air cylinder device or the like.

Referring back to FIG. 14, in substrate stage device PST$_7$ related to the seventh embodiment, a substrate exchange position is set on the +Z side of the fourth and fifth air levitation unit rows. After the exposure processing on substrate P is completed, the main controller that is not illustrated releases the holding by adsorption of substrate P using holding unit 65 of substrate holding frame 760 in a state where air levitation units 750 of the fourth and fifth air levitation unit rows are located below (on the −Z side of) substrate P shown in FIG. 14, and in this state, synchronously controls the eight air levitation units 750 respectively, separates substrate P from substrate holding frame 760 and moves substrate P in the +Z direction (see FIG. 15). At the position shown in FIG. 15, substrate P is carried out of substrate stage device PST$_7$ by a substrate exchanging device that is not illustrated, and after that, a new substrate that is not illustrated is carried to the position shown in FIG. 15. The new substrate is moved in the −Z direction in a state supported by the eight air levitation units 750 from below in a noncontact manner, and then, is held by adsorption by substrate holding frame 760. Incidentally, when substrate P is carried out and carried in by the substrate exchanging device, or when substrate P is delivered to substrate holding frame 760, substrate P and air levitation units 750 can be in a contact state, instead of being in a noncontact state.

In substrate stage device PST, as described above, main sections 51 of a plurality of air levitation units 750 are configured movable in the Z-axis direction, and therefore by making substrate holding frame 760 move along the XY plane to be positioned below the substrate exchange position, substrate P can be separated from substrate holding frame 760 and only substrate P can be moved to the substrate exchange position without difficulty.

Eighth Embodiment

Next, an eighth embodiment is described with reference to FIG. 16. Since a liquid crystal exposure apparatus of the eighth embodiment has a configuration similar to the configuration of each of the liquid crystal exposure apparatuses of the first to seventh embodiments except that a configuration of a substrate stage device is different, only the configuration of the substrate stage device is described below. Incidentally, members which have functions similar to those in the first to seventh embodiments described above are denoted by the same reference signs as the reference signs in the first to seventh embodiments described above and the description thereabout is omitted.

Figure 16:
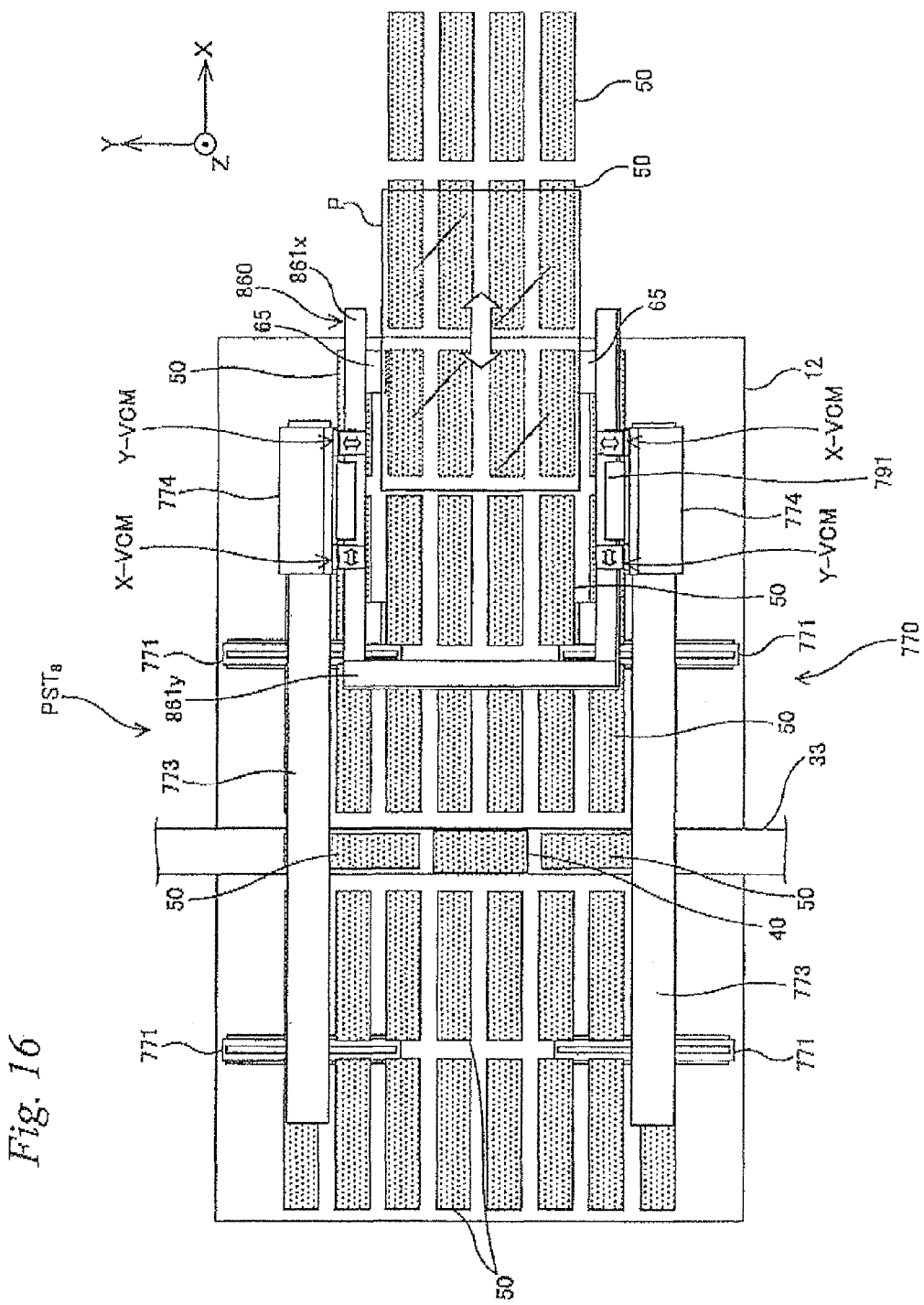
FIG. 16 is a plan view of a substrate stage device related to an eighth embodiment.

As shown in FIG. 16, a substrate holding frame 860 of a substrate stage device $PST_8$ related to the eighth embodiment has a pair of X frame members 861x each of which is made up of a plate-shaped member with the X-axis direction serving as its longitudinal direction and which are spaced apart at a predetermined distance in the Y-axis direction, and the −X side end of each of the pair of X frame members 861x is connected to a Y frame members 861y made up of a plate-shaped member with the Y-axis direction serving as its longitudinal direction. Accordingly, substrate holding frame 860 has a U-like outer shape (contour) that is opened on the −X side in a planar view. Therefore, in a state where the holding by adsorption by a plurality of holding units 65 of substrate holding frame 860 is released, substrate P can pass through an opening section formed at the +X side end of substrate holding frame 860 by moving in the +X direction with respect to substrate holding frame 860. Incidentally, the configuration of drive unit 770 (XY two-dimensional stage device) that guides substrate holding frame 860 along the XY plane during an exposure operation or the like is the same as that of the seventh embodiment described above.

Further, substrate stage device $PST_8$ of the eighth embodiment has a fifth air levitation unit row, which is composed of six air levitation units 50 disposed at a predetermined distance in the Y-axis direction, in an area on the +X side of fixed-point stage 40, which is located on the +X side of the fourth air levitation unit row. Further, substrate stage device $PST_8$ has two rows, which are placed at a predetermined distance in the X-axis direction, of air levitation unit rows each of which is composed of four air levitation units 50 disposed at a predetermined distance in the Y-axis direction, in an area on the +X side of surface plate 12 on floor surface F (see FIGS. 1 and 3). The upper surface (gas jetting surface) of each of the eight air levitation units 50 in total that configure the two rows of the air levitation unit rows is placed coplanar (flush) with the upper surfaces of a plurality of air levitation units 50 on surface plate 12.

In substrate stage device $PST_8$ related to the eighth embodiment, substrate P can be drawn in the +X direction from substrate holding frame 860 and can be carried to, for example, the substrate exchange position, in a state where the holding of substrate P by a plurality of holding units 65 of substrate holding frame 860 is released. As a method of carrying substrate P to the substrate exchange position, for example, a plurality of air levitation units can be provided with an air conveyer function to carry (send) substrate P in a horizontal direction, or a mechanical carrier device can be used. According to substrate stage device $PST_8$ related to the eighth embodiment, since substrate P can easily and promptly be carried to the substrate exchange position by horizontally moving substrate P, the throughput is improved. Incidentally, a configuration can be employed in which when the substrate is drawn from the substrate holding frame via the opening section, and when the substrate is inserted into the substrate holding frame via the opening section, the holding units that hold the substrate by adsorption can be withdrawn from the movement course of the substrate (e.g. a configuration in which the holding units can be moved in vertical directions or can be housed inside the respective frame members that configure the substrate holding frame). In this case, the exchange of substrates can be performed more reliably.

Incidentally, the first to eighth embodiments described above can appropriately be combined. For example, a substrate holding frame that has a configuration similar to the substrate holding frame of the second embodiment described earlier can be used in each of the substrate stage devices related to the third to sixth embodiments described earlier.

Ninth Embodiment

Figure 17:
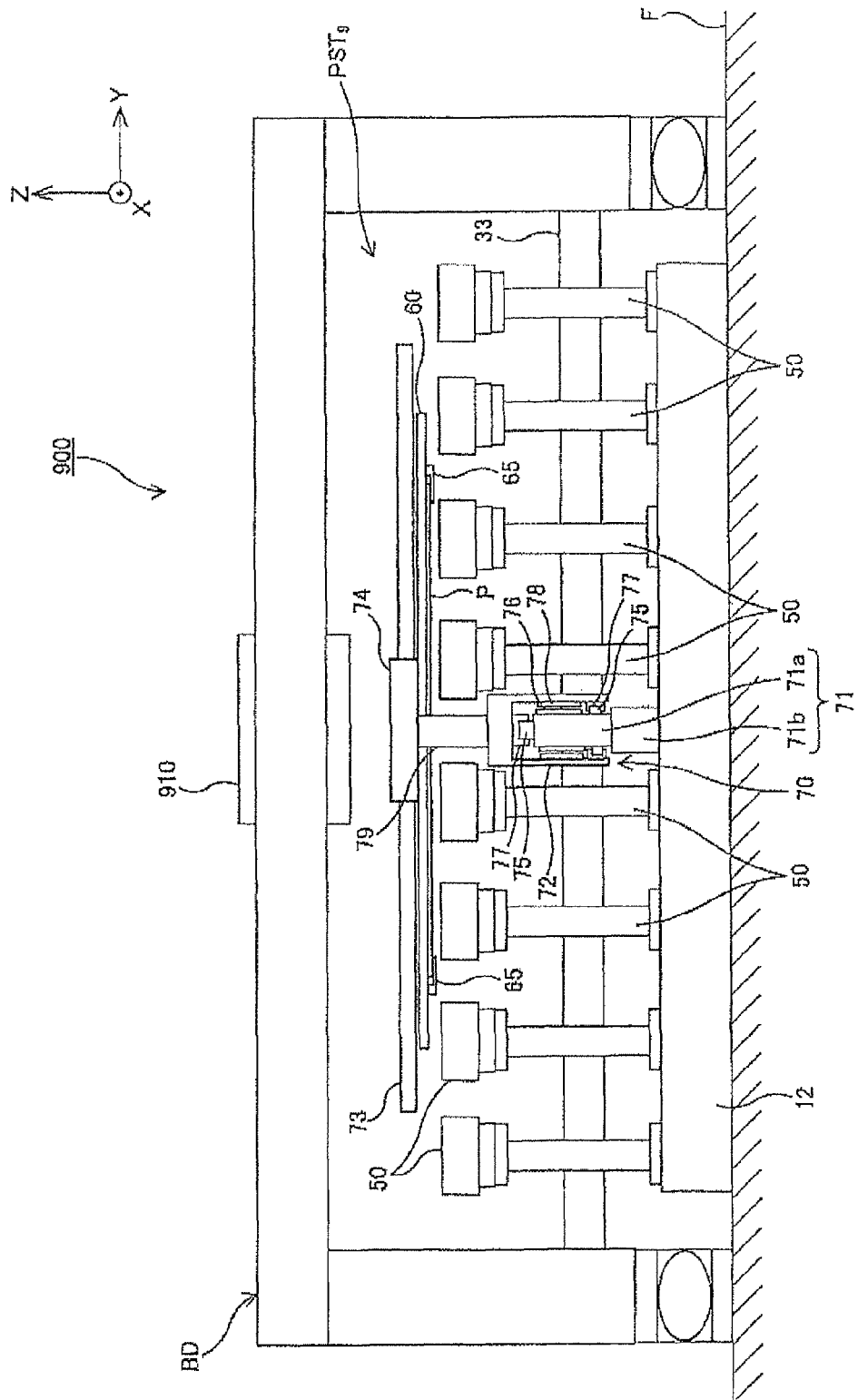
FIG. 17 is a view showing a schematic configuration of a substrate inspecting apparatus related to a ninth embodiment.

Next, a ninth embodiment is described. The substrate stage device related to each of the first to eighth embodiments is arranged in a liquid crystal exposure apparatus, whereas a substrate stage device $PST_9$ related to the present ninth embodiment is arranged in a substrate inspecting apparatus 900 as shown in FIG. 17.

Substrate inspecting apparatus 900 has a photographic unit 910 that is supported by body BD. Photographic unit 910 has a photographic optical system that includes, for example, an image sensor such as a CCD (Charge-Coupled Device), a lens and the like which are not illustrated, and photographs the surface of substrate P placed directly under (on the −Z side of) photographic unit 910. The outputs from photographic unit 910 (image data of the substrate P surface) are output to the outside, and inspection (e.g. detection of defects of patterns, or particles and the like) of substrate P is performed based on the image data. Note that substrate stage device $PST_9$, which substrate inspecting apparatus 900 has, has a configuration that is the same as the configuration of substrate stage device $PST_1$ of the first embodiment described above (see FIG. 1). When the inspection of substrate P is performed, the main controller adjusts the surface position of a portion subject to inspection (a portion directly under photographic unit 910) of substrate P using fixed-point stage 40 (see FIG. 2) such that the surface position is located within a depth of focus of the photographic optical system that photographic unit 910 has. Consequently, clear image data of substrate P can be obtained. Further, since the positioning of substrate P can be performed at high speed and with high precision, the inspection efficiency of substrate P is improved. Incidentally, as the substrate stage device of the substrate inspecting apparatus, either one of the other substrate stage devices related to the second to eighth embodiments described above can be applied. Incidentally, in the ninth embodiment described above, while the case where inspecting apparatus 900 is based on the imaging method is shown as an example, the inspecting apparatus is not limited to being based on the imaging method but can be based on another method, diffraction/scattering detection, or scatterometry or the like.

Incidentally, in each of the embodiments above, the fixed-point stage can employ a configuration that displaces the area subject to exposure (or the area subject to photographing) of the substrate only in the Z-axis direction, of the Z-axis direction and the θx and θy directions. Further, in each of the embodiments above, while the surface position of the area subject to exposure (or the area subject to photographing) of the substrate is adjusted directly under the projection optical system (or the photographic unit) using the fixed-point stage, the fixed-point stage does not necessarily have to be arranged in the case of an object moving apparatus for an apparatus in which the surface position of a substrate needs not to be controlled with high precision.

Further, in each of the embodiments above, while the substrate is guided along the horizontal plane by the drive unit (XY two-dimensional stage device) that drives the substrate in the orthogonal two axial directions which are the X-axis and the Y-axis directions, the drive unit should guide the substrate only in one axial direction as far as, for example, the exposure area on the substrate and the substrate are the same in width.

Further, in each of the embodiments above, the plurality of air levitation units support the substrate by levitation so as to make the substrate parallel to the XY plane, but depending on a type of an object that is subject to support, the configuration of the device that levitates the object is not limited thereto, and for example, the object can be levitated by magnetism or static electricity. Similarly, as the air chuck unit of the fixed-point stage, depending on a type of an object that is subject to holding, a configuration of holding an object that is subject to holding by magnetism or static electricity can also be employed.

Further, in each of the embodiments above, while the positional information of the substrate holding frame within the XY plane is obtained by the laser interferometer system that includes the laser interferometers that irradiate the movable mirrors arranged at the substrate holding frame with the measurement beams, the position measuring device of the substrate holding frame is not limited thereto, and for example, a two-dimensional encoder system can be used. In this case, for example, scales are arranged on the substrate holding frame and the positional information of the substrate holding frame can be obtained by heads fixed to the body or the like, or heads are arranged on the substrate holding frame and the positional information of the substrate holding frame can be obtained using scales fixed, for example, to the body or the like.

Further, in each of the embodiments above, while the substrate holding frame has an outer shape (contour) that is rectangular in a planar view and the opening section that is rectangular in a planar view, the shape of the member that holds the substrate is not limited thereto, and for example, the shape can appropriately be changed in accordance with the shape of an object that is subject to holding (e.g. when an object is discoidal, a holding member can also have a circular frame shape).

Incidentally, in each of the embodiments above, the substrate holding frame does not have to enclose the whole periphery of the substrate, and it is also possible that a part of the periphery is not enclosed. Further, a member to hold the substrate such as the substrate holding frame does not necessarily have to be used for substrate carriage. In this case, it is necessary to measure the position of the substrate itself, and the position of the substrate can be measured by, for example, an interferometer that irradiates a measurement beam on the side surface of the substrate that serves as a mirror surface. Or, it is also possible that a grating is formed on the front surface (or the rear surface) of the substrate and the position of the substrate is measured by an encoder equipped with a head that irradiates the grating with a measurement light and receives diffraction light of the measurement light.

Further, the illumination light can be ultraviolet light, such as ArF excimer laser light (with a wavelength of 193 nm) and KrF excimer laser light (with a wavelength of 248 nm), or vacuum ultraviolet light such as $F_2$ laser light (with a wavelength of 157 nm). Further, as the illumination light, a harmonic wave, which is obtained by amplifying a single-wavelength laser light in the infrared or visible range emitted by a DFB semiconductor laser or fiber laser with a fiber amplifier doped with, for example, erbium (or both erbium and ytteribium), and by converting the wavelength into ultraviolet light using a nonlinear optical crystal, can also be used. Further, solid state laser (with a wavelength of 355 nm, 266 nm) or the like can also be used.

Further, in each of the embodiments above, while the case has been described where projection optical system PL is the projection optical system by a multi-lens method that is equipped with a plurality of optical systems, the number of the projection optical systems is not limited thereto, but there should be one or more projection optical systems. Further, the projection optical system is not limited to the projection optical system by a multi-lens method, but can be a projection optical system using, for example, a large mirror of the Offner type, or the like. Further, while the case has been described where the projection optical system whose projection magnification is equal magnification is used as projection optical system PL in each of the embodiments above, this is not intended to be limiting, and the projection optical system can be either of a reduction system or a magnifying system.

Further, in each of the embodiments above, while the case has been described where the exposure apparatus is a scanning stepper, this is not intended to be limiting, and each of the embodiments above can also be applied to a static type exposure apparatus such as a stepper. Further, each of the embodiments above can also be applied to a projection exposure apparatus by a step-and-stitch method that synthesizes a shot area and a shot area. Further, each of the embodiments above can also be applied to an exposure apparatus by a proximity method that does not use any projection optical systems.

Further, the application of the exposure apparatus is not limited to the exposure apparatus for liquid crystal display elements in which a liquid crystal display element pattern is transferred onto a rectangular glass plate, but each of the embodiments above can also be widely applied, for example, to an exposure apparatus for manufacturing semiconductors, and an exposure apparatus for producing thin-film magnetic heads, micromachines, DNA chips, and the like. Further, each of the embodiments above can be applied not only to an exposure apparatus for producing microdevices such as semiconductor devices, but can also be applied to an exposure apparatus in which a circuit pattern is transferred onto a glass substrate, a silicon wafer or the like to produce a mask or a reticle used in a light exposure apparatus, an EUV exposure apparatus, an X-ray exposure apparatus, an electron-beam exposure apparatus, and the like. Incidentally, an object that is subject to exposure is not limited to a glass plate, but for example, can be another object such as a wafer, a ceramic substrate, a film member, or a mask blank.

Incidentally, the substrate stage device related to each of the embodiments above can be applied not only to the exposure apparatus but also to, for example, an element manufacturing apparatus equipped with a functional liquid deposition device by an ink-jet method.

Incidentally, the disclosures of all publications, the PCT International Publications, the U.S. Patent Application Publications and the U.S. Patents that are cited in the description so far and are related to exposure apparatuses and the like are each incorporated herein by reference.

Device Manufacturing Method

A manufacturing method of a microdevice that uses the exposure apparatus in each of the embodiments above in a lithography process is described next. In the exposure apparatus in each of the embodiments above, a liquid crystal display element as a microdevice can be obtained by forming a predetermined pattern (such as a circuit pattern or an electrode pattern) on a plate (a glass substrate).

Pattern Forming Process

First of all, a so-called optical lithography process in which a pattern image is formed on a photosensitive substrate (such as a glass substrate coated with a resist) is executed using the exposure apparatus in each of the embodiments above. In this optical lithography process, a predetermined pattern that includes many electrodes and the like is formed on the photosensitive substrate. After that, the exposed substrate undergoes the respective processes such as a development process, an etching process and a resist removing process, and thereby the predetermined pattern is formed on the substrate.

Color Filter Forming Process

Next, a color filter in which many sets of three dots corresponding to R (Red), G (Green) and B (blue) are disposed in a matrix shape, or a color filter in which a plurality of sets of filters of three stripes of R, G and B are disposed in horizontal scanning line directions is formed.

Cell Assembling Process

Next, a liquid crystal panel (a liquid crystal cell) is assembled using the substrate having the predetermined pattern obtained in the pattern forming process, the color filter obtained in the color filter forming process, and the like. For example, a liquid crystal panel (a liquid crystal cell) is manufactured by injecting liquid crystal between the substrate having the predetermined pattern obtained in the pattern forming process and the color filter obtained in the color filter forming process.

Module Assembling Process

After that, a liquid crystal display element is completed by attaching respective components such as an electric circuit that causes a display operation of the assembled liquid crystal panel (liquid crystal cell) to be performed, and a backlight.

In this case, since exposure of the plate is performed with high throughput and high precision using the exposure apparatus in each of the embodiments above in the pattern forming process, the productivity of liquid crystal display elements can be improved as a consequence.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes a tabular object with an energy beam via a pattern, the apparatus comprising:
    an optical system that irradiates the energy beam via the pattern on a partial area within a predetermined two-dimensional plane parallel to a horizontal plane;
    a movable body that has a frame-shaped member placed along the two-dimensional plane, and that is movable along the two-dimensional plane, holding an end of the tabular object such that the end of the tabular object is along the frame-shaped member, the frame-shaped member substantially surrounding an entire perimeter of the tabular object;
    a drive device that drives the movable body that holds the tabular object at least in one axial direction within a predetermined area that includes the partial area within the two-dimensional plane; and
    a stage that holds a section, including the partial area on which the energy beam is irradiated, of the tabular object in a noncontact state from below the tabular object so that the section is movable in a direction intersecting the two-dimensional plane, the tabular object being held by the movable body that is driven by the drive device.

2. The exposure apparatus according to claim 1, further comprising:
    a noncontact support device that supports the tabular object in a noncontact manner from below, with a support surface of the support device made to be opposed to an other area of the tabular object, excluding the section held by the stage.

3. The exposure apparatus according to claim 2, wherein the noncontact support device supports the tabular object in a noncontact manner by jetting a gas from the support surface to the tabular object.

4. The exposure apparatus according to claim 2, wherein at least a part of the support surface of the noncontact support device is arranged to be movable in the direction intersecting the two-dimensional plane, and
    the noncontact support device separates the tabular object from the movable body and moves the tabular object in the direction intersecting the two-dimensional plane, by movement of the at least a part of the support surface in the direction intersecting the two-dimensional plane.

5. The exposure apparatus according to claim 1, further comprising:
    a surface position measuring system that measures a distribution of surface positions, in a direction perpendicular to the two-dimensional plane, of an upper surface of the tabular object within a part of the predetermined area.

6. The exposure apparatus according to claim 1, wherein the tabular object is a substrate with a size not less than 500 mm.

7. A device manufacturing method, comprising:
    exposing the tabular object using the exposure apparatus according to claim 1; and
    developing the exposed tabular object.

8. A flat-panel display manufacturing method, comprising:
    exposing a substrate for a flat-panel display using the exposure apparatus according to claim 1; and
    developing the substrate that has been exposed.

9. The exposure apparatus according to claim 1, wherein the movable body has a holding member that holds by adsorption at least a part of an outer periphery of the tabular object from below, and
    the holding member is connected to the frame-shaped member and can be displaced with respect to the frame-shaped member in a direction orthogonal to the two-dimensional plane in a state holding the tabular object.

10. The exposure apparatus according to claim 1, wherein the movable body has a pressing device that causes the frame-shaped member to hold the tabular object by pressing the tabular object from one of a pair of opposed surfaces that are opposed to each other, toward the other of the opposed surfaces, the opposed surfaces being of inner wall surfaces of the frame-shaped member.

11. The exposure apparatus according to claim 1, further comprising:
    an optical interferometer system that obtains positional information of the movable body within the two-dimensional plane, by irradiating a reflection surface arranged at the movable body with a measurement beam and receiving the measurement beam reflected off the reflection surface.

12. The exposure apparatus according to claim 1, wherein the stage has a holding surface that holds the tabular object in a noncontact manner by jetting a gas to a lower surface of the tabular object and suctioning a gas between the lower surface of the tabular object and the holding surface.

13. The exposure apparatus according to claim 12, wherein in the stage, at least one of a pressure and a flow rate of the gas between the tabular object and the holding surface is variable such that a distance between the tabular object and the holding surface is constant.

14. The exposure apparatus according to claim 12, wherein the stage has an actuator that drives a holding section of the stage in the direction intersecting the two-dimensional plane, the holding section holding the tabular object in a noncontact manner.

15. The exposure apparatus according to claim 14, wherein the actuator includes a mover that is connected to the holding section and a stator that moves the mover in a noncontact manner in the direction intersecting the two-dimensional plane.

16. The exposure apparatus according to claim 12, wherein a holding section of the stage that holds the tabular object in a noncontact manner is separated from the drive device in terms of vibration.

17. The exposure apparatus according to claim 1, wherein a position along the two-dimensional plane of the stage is substantially fixed with respect to the partial area on which the energy beam is irradiated.

18. The exposure apparatus according to claim 1, wherein an area size of a holding surface, opposed to the tabular object in a noncontact state, of the stage is smaller than an area size of the tabular object.

19. The exposure apparatus according to claim 1, wherein the stage has a holding section that holds a lower surface of the tabular object in a noncontact manner, and a support device that supports the holding section and generates a force to the holding section in a direction that cancels a weight of the holding section.

20. The exposure apparatus according to claim 1, wherein the frame-shaped member has a rectangular outer contour.

21. An exposure method of exposing a tabular object with an energy beam via a pattern, the method comprising:
holding an end of the tabular object by a movable body, which has a frame-shaped member placed along a predetermined two-dimensional plane parallel to a horizontal plane, such that the end of the tabular object is along the frame-shaped member, the frame-shaped member substantially surrounding an entire perimeter of the tabular object,
irradiating the energy beam via the pattern on a partial area within the two-dimensional plane;
driving the movable body that holds the tabular object, at least in one axial direction within a predetermined area that includes the partial area within the two-dimensional plane; and
holding a section, including the partial area on which the energy beam is irradiated, of the tabular object in a noncontact state from below the tabular object by a stage arranged movable, in a direction intersecting the two-dimensional plane, when the movable body is driven.

22. The exposure method according to claim 21, further comprising:
supporting an other area of the tabular object, excluding the section, in a noncontact manner from below.

23. The exposure method according to claim 22, further comprising:
jetting a gas to a lower surface of the other area of the tabular object from a support surface opposed to the lower surface, to make the support surface and the lower surface be in a noncontact state.

24. A device manufacturing method, comprising:
exposing the tabular object using the exposure method according to claim 21; and
developing the exposed tabular object.

25. The exposure method according to claim 21, further comprising:
holding by adsorption at least a part of an outer periphery of the tabular object displaceably in a direction orthogonal to the two-dimensional plane, from below the tabular object by a holding member connected to the frame-shaped member.

26. The exposure method according to claim 21, further comprising:
causing the frame-shaped member to hold the tabular object by pressing the tabular object from one of a pair of opposed surfaces that are opposed to each other, toward the other of the opposed surfaces, the opposed surfaces being of inner wall surfaces of the frame-shaped member.

27. The exposure method according to claim 21, further comprising:
irradiating a reflection surface arranged at the movable body with a measurement beam;
receiving the measurement beam reflected off the reflection surface; and
obtaining positional information of the movable body within the two-dimensional plane, based on a result of receiving the measurement beam.

28. The exposure method according to claim 21, further comprising:
jetting a gas from the stage to a lower surface of the tabular object and suctioning a gas between the stage and the lower surface of the tabular object, to keep a noncontact state between the stage and the tabular object.

29. The exposure method according to claim 28, further comprising:
adjusting at least one of a pressure and a flow rate of the gas between the tabular object and the stage, to keep a distance between the tabular object and the stage constant.

30. The exposure method according to claim 21, further comprising:
substantially fixing a position along the two-dimensional plane of the stage with respect to the partial area on which the energy beam is irradiated.

31. The exposure method according to claim 21, wherein an area size of a holding surface, opposed to the tabular object in a noncontact state, of the stage is smaller than an area size of the tabular object.

32. The exposure method according to claim 21, further comprising:
separating a holding section of the stage that holds the tabular object in a noncontact manner from a drive device that drives the movable body the at least in one axial direction, in terms of vibration.

33. The exposure method according to claim 21, further comprising:
supporting a holding section that holds a lower surface of the tabular object in a noncontact manner, and generating a force to the holding section in a direction that cancels a weight of the holding section.

34. The exposure method according to claim 21, wherein the frame-shaped member has a rectangular outer contour.

* * * * *